United States Patent
Archie et al.

(10) Patent No.: US 7,286,247 B2
(45) Date of Patent: Oct. 23, 2007

(54) ASSESSMENT AND OPTIMIZATION FOR METROLOGY INSTRUMENT INCLUDING UNCERTAINTY OF TOTAL MEASUREMENT UNCERTAINTY

(75) Inventors: Charles N. Archie, Granite Springs, NY (US); G. William Banke, Jr., Essex Junction, VT (US); Matthew J. Sendelbach, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 47 days.

(21) Appl. No.: 11/062,668

(22) Filed: Feb. 22, 2005

(65) Prior Publication Data

US 2005/0197772 A1 Sep. 8, 2005

Related U.S. Application Data

(63) Continuation-in-part of application No. 10/524,286, filed as application No. PCT/US02/041180 on Dec. 20, 2002.

(60) Provisional application No. 60/546,590, filed on Feb. 20, 2004, provisional application No. 60/546,591, filed on Feb. 20, 2004.

(51) Int. Cl.
*G01B 11/14* (2006.01)

(52) U.S. Cl. ...................... 356/625; 700/121

(58) Field of Classification Search ............... 356/625, 356/635, 636, 237.1–237.5; 700/97, 121
See application file for complete search history.

(56) References Cited

U.S. PATENT DOCUMENTS

| 5,835,227 | A | 11/1998 | Grodnensky et al. |
| 6,055,045 | A | 4/2000 | Weill et al. |
| 7,209,798 | B2 * | 4/2007 | Yamashita et al. .......... 700/121 |
| 2005/0222804 | A1 * | 10/2005 | Archie et al. ............... 702/155 |
| 2006/0132749 | A1 * | 6/2006 | Bruls et al. .................. 355/69 |

OTHER PUBLICATIONS

Banke, B. et al., "Characteristics of Accuracy for CD Metrology," Proceedings of SPIE, vol. 3677 (1999), pp. 291-308.

* cited by examiner

*Primary Examiner*—Hoa Q. Pham
(74) *Attorney, Agent, or Firm*—Steven Capella; Hoffman, Warnick & D'Alessandro, LLC

(57) ABSTRACT

Methods and related program product for assessing and optimizing metrology instruments by determining a total measurement uncertainty (TMU) based on precision and accuracy. The TMU is calculated based on a linear regression analysis and removing a reference measuring system uncertainty ($U_{RMS}$) from a net residual error. The TMU provides an objective and more accurate representation of whether a measurement system under test has an ability to sense true product variation. The invention also includes a method for determining an uncertainty of the TMU.

30 Claims, 10 Drawing Sheets

ASSESSMENT AND OPTIMIZATION FOR METROLOGY INSTRUMENT INCLUDING UNCERTAINTY OF TOTAL MEASUREMENT UNCERTAINTY

CROSS-REFERENCE TO RELATED APPLICATIONS

This application is a continuation-in-part of application Ser. No. 10/524,286, filed Feb. 10, 2005, which claims benefit of P.C.T. Application No. PCT/US2002/041180, filed Dec. 20, 2002. This application also claims benefit of U.S. Provisional Patent Application Nos. 60/546,590 and 60/546,591, both filed Feb. 20, 2004, each of which is hereby incorporated herein.

BACKGROUND OF THE INVENTION

1. Technical Field

The present invention relates generally to metrology instruments.

2. Background Art

Efficient semiconductor manufacturing requires highly precise and accurate metrology instruments. In particular, a metrology instrument is required to achieve small tolerances to achieve better quality products and fewer rejections in the manufacturing process. For example, the 1999 Edition of the International Technology Roadmap for Semiconductors lists the necessary precision needed for isolated line control in the year 2001 to be 1.8 nm. Unfortunately, correctly assessing and optimizing the measurement potential of a metrology instrument is difficult for a number of reasons. For example, an evaluator normally has limited access to the various instruments under consideration. In addition, each instrument needs to be evaluated under a wide range of conditions in order to gain a valid impression of how it will perform in the actual manufacturing setting. Finally, there are no widely accepted standards relative to the required parameters and how the parameters should be measured. As a result, an adequate solution for calculating an uncertainty of a metrology instrument in meaningful units of length for comparison to manufacturing lithography requirements has been elusive.

Current assessment methods are often based on the repeatability and reproducibility (R&R) of an instrument. For a critical dimension (CD) metrology instrument, evaluation is often executed by pulling representative samples of partially constructed product wafers from a manufacturing line. Recipes (programming instructions) are then implemented on an instrument under evaluation such that estimates of the static repeatability and long term reproducibility can be made. For example, to determine static repeatability for a measurement of a given product level, a recipe is implemented to cause the CD metrology instrument to navigate to a particular site on the wafer and then repeatedly measure the size of a given feature. The measurement repeatability is determined from the standard deviation of the acquired data. Long term reproducibility, also called precision, is determined in a similar way to static repeatability except that between each measurement the sample is removed from the instrument for an arbitrary length of time ranging from seconds to days. Unfortunately, the repeatability and reproducibility of a measurement is meaningless if the measurement is wrong. Accuracy must also be considered. The above-described methods do not evaluate the accuracy of an instrument apart from ensuring proper magnification by calibration with pitch standards.

The reason, in part, that accuracy is not considered is that accepted accuracy standards are generally not available because the speed at which semiconductor technology advances usually makes any standard obsolete very quickly. The result of these methodologies is that a measurement system under test may be misleadingly denoted as trustworthy.

One proposed solution for metrology instrument assessment introduces new parameters related to accuracy in addition to precision. See Banke and Archie, "Characteristics of Accuracy for CD Metrology," Proceedings of SPIE, Volume 3677, pp. 291-308 (1999). This approach deviates from using standard product wafers as samples by, for example, constructing wafers referred to as focus and exposure matrix (FEM) wafers. In this methodology, the actual CD value is determined for various fields on the FEM by using a respected reference measurement system (RMS). Following this approach, the RMS values and measurements from the instrument under test are compared by a linear regression method that is valid for situations where both variables are subject to error. Use of the FEM wafers is advantageous because they provide examples of product variation that under normal manufacturing line circumstances may occur only after a considerable time has passed. Important parameters of this methodology include the regression slope, the average offset, and a "poorness-of-fit" parameter called nonlinearity. Despite the existence of this suite of parameters for repeatability, reproducibility and accuracy, however, an evaluator must still determine, somewhat arbitrarily, how to combine these various parameters to assess or optimize an instrument.

In view of the foregoing, there is a need in the art for improved methods of assessing and optimizing metrology instruments.

SUMMARY OF THE INVENTION

The invention relates to methods for assessing and optimizing metrology instruments by determining a total measurement uncertainty (TMU) based on precision and accuracy. The TMU is calculated based on a linear regression analysis and removing a reference measuring system uncertainty ($U_{RMS}$) from a net residual error. The invention improves the TMU analysis by providing improved methods for determining the $U_{RMS}$ under a variety of situations. The TMU provides an objective and more accurate representation of whether a measurement system under test has an ability to sense true product variation. The invention also includes a method for determining an uncertainty of the TMU.

The foregoing and other features of the invention will be apparent from the following more particular description of embodiments of the invention.

BRIEF DESCRIPTION OF THE DRAWINGS

The embodiments of this invention will be described in detail, with reference to the following figures, wherein like designations denote like elements, and wherein.

DETAILED DESCRIPTION OF THE INVENTION

The description includes the following headings for clarity purposes only: I. Data Analysis, II. Assessment Method, III. Optimization Method, IV. Improved Reference Measurement System Uncertainty Calculation, V. Uncertainty of Total Measurement Uncertainty (TMU), VI. General TMU Uncertainty Estimate for Preferred RMS Uncertainty Estimate, and VII. Conclusion. It should be recognized that while particular types of measurement systems will be mentioned throughout the description that the teachings of the invention are applicable to any type of measurement system. As will be described below, the discussion of calculation of $U_{RMS}$ of Section IV can be substituted for the calculation methods described in sections I-III.

I. Data Analysis

Figure 1:
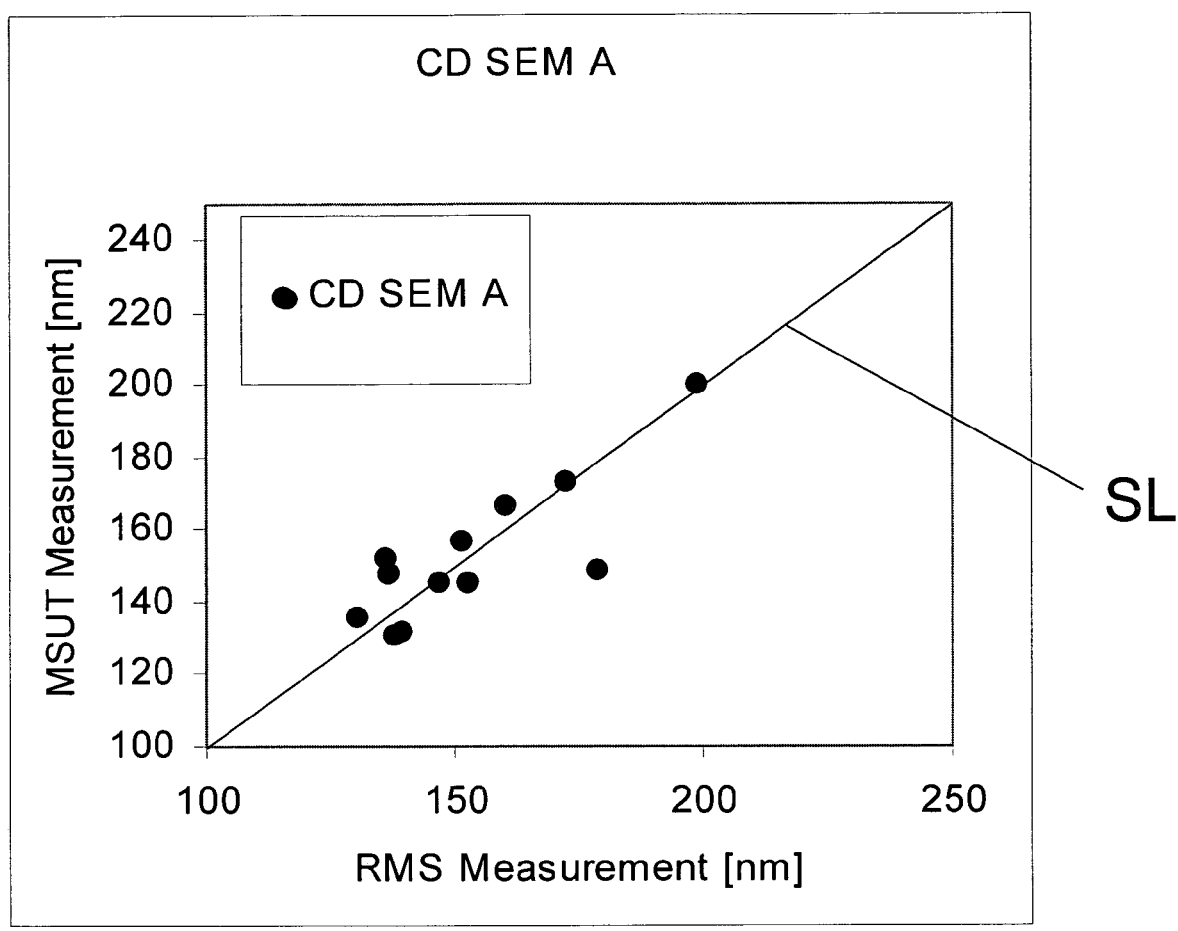
FIG. 1 shows a graph of data for a measurement system under test versus a reference measurement system.

In order to determine a total measurement uncertainty (hereinafter "TMU") of a measurement system under test (hereinafter "MSUT"), it is necessary to compare measurement data sets of a MSUT and a reference measurement system (hereinafter "RMS"). A conventional technique for comparing such data sets is linear regression derived by plotting the data sets against one another as shown in FIG. 1. The following data analysis is derived from the paper "Characteristics of Accuracy for CD Metrology," Proceedings of SPIE, Volume 3677, pp. 291-308 (1999) by Banke and Archie, which describes a form of linear regression upon which the invention draws. As used herein, precision shall be referred as a one sigma ($\sigma$) value.

When regressing one variable onto another an assumption is made about the relationship between the two variables. Referring to FIG. 1, it is assumed that a MSUT, e.g., a CD SEM, should behave linearly to the first order when compared to a set of reference standards, i.e., those from an RMS, e.g., a CD AFM. Such a model would be represented by a slope, $\beta$, and an intercept, $\alpha$, like the following equation:

$$y_i = \alpha + \beta x_i + \epsilon_i \quad (1)$$

where $y_i$ and $x_i$ represent the $i^{th}$ dependent and independent variables, respectively, and $\epsilon_i$ is the $i^{th}$ deviation, or residual, from the model. In terms of the metrology instrument assessment and optimization data analysis and methods, as discussed in more detail below, the independent variable x refers to the MSUT and the dependent variable y refers to the RMS.

The ordinary least-squares (hereinafter "OLS") fit is one type of general linear regression analysis, in which no error is assumed in the independent variable (MSUT). However, there are situations, especially in the case of semiconductor industry metrology applications, where this assumption is not valid. There are criteria that give some indication as to when, or under what conditions, it is permissible to use the OLS. One criterion is based upon the precision of the independent variable, $\sigma_x$, being small compared to the standard deviation of all the x values:

$$\frac{\sigma_{all\,x\,values}}{\sigma_x} \gg 1 \quad (2)$$

Another criterion for acceptable use of the OLS fit is:

$$|\beta| \times \frac{\sigma_x}{\sigma_y} \ll 1 \quad (3)$$

If the estimated slope is approximately unity, it is easy to see that the precision in the independent measurement (MSUT) must be much smaller, or better, than the precision in the dependent variable (RMS) for the OLS to be valid. Perhaps most important in testing the accuracy of an unknown MSUT is the effect of the uncertainty in the reference standards on the resultant parameters that are used to assess this accuracy. To account for this, a method of linear regression that addresses errors in the y (RMS) and x (MSUT) variables and estimates the slope and intercept of the resultant best-fit line is necessary to fairly evaluate the accuracy of a measurement system.

The Mandel linear regression, as introduced in 1964 and revised in 1984 by John Mandel, provides a methodology of handling the least-squares fit when both variables are subject to error. One of the benefits of this more generalized regression analysis is that it can be used in all degrees of error in x and y, even the case when errors in x are zero, $\sigma_x=0$. One parameter affecting the Mandel method is a variable $\lambda$ (referred to herein as the "ratio variable"), which is defined by:

$$\lambda = \frac{\sigma_y^2}{\sigma_x^2} \quad (4)$$

where $\sigma_y$ and $\sigma_x$ are the precisions of the y (RMS) and x (MSUT) measurements, respectively. In the Mandel method, it is important to recognize that these precisions are based on replication only, not accuracy. According to the invention, the ratio variable $\lambda$ is re-defined as:

$$\lambda = \frac{U_{RMS}^2}{U_{MSUT}^2} \quad (5)$$

where $U_{RMS}$ is an RMS "uncertainty" defined as an RMS precision ($\sigma_{RMS}$) or an independently determined RMS total measurement uncertainty ($TMU_{RMS}$), and $U_{MSUT}$ is an MSUT "uncertainty" defined as a corrected precision of the MSUT or a TMU of the MSUT, as will be more fully described below. The $TMU_{RMS}$ can be determined using the methods as described herein applied to the RMS, i.e., treating the RMS as an MSUT. Unless denoted "$TMU_{RMS}$," "TMU" shall refer to the TMU for the MSUT.

The intent of the Mandel method is to start the analysis of the fitting procedure with some measure of the confidence level for each measurement. A key metric resulting from this regression is the slope of the best-fit line:

$$\hat{\beta} = \frac{S_{yy} - \lambda S_{xx} + \sqrt{(S_{yy} - \lambda S_{xx})^2 + 4\lambda S_{xy}^2}}{2S_{xy}} \qquad (6)$$

where the $S_{xx}$, $S_{yy}$, and $S_{xy}$ are the sum of the squares from the raw data as defined by:

$$S_{xx} = \sum_{i=1}^{N}(x_i - \bar{x})^2, \; S_{yy} = \sum_{i=1}^{N}(y_i - \bar{y})^2, \; S_{xy} = \sum_{i=1}^{N}(x_i - \bar{x})(y_i - \bar{y}) \qquad (7)$$

where N is the number of ordered pairs. In the general linear regression case, where OLS is valid, the uncertainty of the independent variable (MSUT) goes to zero and the ratio variable $\lambda \to \infty$. The estimate for the slope as the ratio variable $\lambda$ approaches infinity is $S_{xy}/S_{xx}$ and when all the error is in the x (MSUT) measurement compared to the y (RMS) measurement, the ratio variable $\lambda$ approaches zero and the estimate for the slope is $S_{yy}/S_{xy}$. This would be like regressing x onto y, which points out another feature of the Mandel method of regression. The analysis is symmetrical with the x and y variables such that it does not matter whether x is regressed on y, or y is regressed on x.

Another metric resulting from this methodology is the corrected precision of a metrology instrument, which is defined as follows:

$$\text{Corrected Precision} = \hat{\beta}\sigma_x \qquad (8)$$

As defined, a smaller slope $\hat{\beta}$ implies a greater change in MSUT measurement for a given change in the RMS values. Use of a corrected precision is useful because a MSUT could exhibit a smaller (better) precision than other tools under test, yet have a larger (worse) slope. A larger slope would imply a less sensitive measurement tool, while on the other hand, a smaller precision would indicate a more resolute measurement capable of being sensitive to small changes. The product of these two estimates acts as a balance for the raw, uncorrected, precision. Therefore, for an equivalent corrected precision of two different MSUTs, a system with a smaller estimated slope $\hat{\beta}$ can accommodate a larger precision $\sigma_x$ to yield an equivalent corrected precision. In other words, the slope corrects the precision to correspond to the RMS calibrated scale.

As a check and balance on the corrected precision, a specification on the slope is also required. It is desirable to have a measurement system with a unity slope (i.e., slope=1) to maintain a constant offset, which varies as a function of the RMS values when the slope is not equal to one. This situation makes for a more complicated correction in a manufacturing environment.

Another parameter of the regression analysis is the estimated intercept, $\hat{\alpha}$. This parameter is dependent upon the estimated slope. As a result, the two parameters of the $1^{st}$-order regression analysis, i.e., $\hat{\alpha}$ and $\hat{\beta}$, are not statistically independent of each other. In addition, since the intercept is a value of y at x=0, it is difficult to get an intuitive meaning of its value. Instead of this parameter of the regression, another parameter called the offset is used and defined here as:

$$\text{Offset} = \Delta = \bar{y} - \bar{x} \qquad (9)$$

where $\bar{x}$ and $\bar{y}$ are the measurement averages of a calibration effort. This parameter is independent of the regression analysis. Recognizing this and considering that for a calibration effort on a MSUT, its measurements will be regressed against the RMS values, the offset is a reflection of the closeness of the MSUT compared to the RMS.

Another check is that the data needs to be tested to see if the x versus y relationship can be described as linear. This check is completed by considering the residual error. The residual error definition is different for the general linear regression (e.g., OLS) case compared to the Mandel case. The residual error for OLS, $d_i$, at each ordered pair of data is defined as:

$$d_i = y_i - \hat{\alpha} - \hat{\beta}x_i \qquad (10)$$

where $\hat{\alpha}$ and $\hat{\beta}$ are the estimated intercept and slope, respectively, of the OLS regression. The net residual error D is the square root of the mean-squared error of these residuals and can be expressed as:

$$D^2 = \frac{\sum_{i=1}^{N} d_i^2}{N-2} \qquad (11)$$

However, this definition of the residual is not correct when the Mandel method is applied to the situation of comparing the RMS to the MSUT. The correct net residual error $D_M$ is given by:

$$D_M = \sqrt{\frac{(\lambda^2 + \hat{\beta}^2)}{(\lambda + \hat{\beta}^2)^2} D^2} \qquad (12)$$

The net residual error $D_M$ is comprised of both systematic and random components of error. The method of data gathering and analysis described herein includes accessing the random component of error by replication, creating essentially a precision estimate. Given precision estimates $\sigma_x$ and $\sigma_y$ for the x (MSUT) and y (RMS) variables, respectively, it is possible to make an estimate of the input variance of the data set:

$$\text{Var(input)} = \sigma_y^2 + \hat{\beta}^2 \sigma_x^2. \qquad (13)$$

The slope is included in the above definition for reasons similar to its introduction into the corrected precision parameter. The ratio of the square of the Mandel net residual error $D_M$ to the input variance is a parameter that distinguishes systematic error from random error in the data set. This quantity is referred to herein as the "nonlinearity" parameter:

$$\text{Nonlinearity} = D_M^2/\text{Var(input)} \qquad (14)$$

When the nonlinearity can be shown to be statistically significantly greater than unity, then the regression is revealing that the data contains significant nonlinear systematic behavior.

The invention determines a metric referred to herein as "total measurement uncertainty" (hereinafter "TMU") that summarizes, in a format directly comparable to measurement requirements, how well the MSUT measures even if its measurements are corrected by the regression slope $\hat{\beta}$ and intercept $\hat{\alpha}$. The TMU metric can be derived from the general linear regression metrics, or preferably from the Mandel metrics. In particular, TMU can be derived from the Mandel net residual error $D_M$. The Mandel net residual error $D_M$ contains contributions from the RMS uncertainty ($U_{RMS}$), the MSUT uncertainty ($U_{MSUT}$), and any nonlinearity in the relationship between measurements from these instruments. Similarly, the TMU can be derived from the net residual error D for a general linear regression, which contains contributions from the RMS uncertainty, i.e., in this case the RMS precision ($\sigma_{RMS}$), the MSUT corrected precision, and any nonlinearity in the relationship between measurements from these instruments.

Conceptually, the TMU is the net residual error ($D_M$ or D) without the contribution from the RMS uncertainty ($U_{RMS}$). TMU assigns to the MSUT measurement all other contributions. As noted above, the "RMS uncertainty" ($U_{RMS}$) is defined as the RMS precision or an independently determined RMS total measurement uncertainty ($TMU_{RMS}$). That is, in one instance, $U_{RMS}$ may simply be considered the precision of the RMS ($\sigma_{RMS}$), i.e., $\sigma_{RMS}$ is used as an estimate of the TMU for the RMS. However, where the RMS has a TMU substantially different than its precision, $TMU_{RMS}$ can be input to the ratio variable $\lambda$ (Eq. 5) for determining the Mandel net residual error $D_M$ and the TMU definition. The $TMU_{RMS}$ may be independently derived for the RMS, i.e., treating the RMS as a MSUT compared to another RMS. Based on above, TMU for a Mandel linear regression can be defined as:

$$TMU = \sqrt{D_M^2 - U_{RMS}^2} \quad (15)$$

where $D_M$ is the Mandel net residual error. Similarly, TMU for a general linear regression, e.g., OLS, can be defined as:

$$TMU = \sqrt{D^2 - U_{RMS}^2} \quad (16)$$

where D is the net residual error.

It should be recognized, relative to the Mandel linear regression, that when the corrected precision of the MSUT is initially used as the MSUT uncertainty ($U_{MSUT}$) to calculate ratio variable $\lambda$, the subsequently determined TMU value for the MSUT from Eq. 15, in some cases, may be substantially different from the corrected precision for the MSUT (i.e., $U_{MSUT}$). In this case, the linear regression may be repeated with the determined TMU value substituted for the corrected precision of the MSUT in the definition of the ratio variable $\lambda$ (Eq. 5). Similarly, when the subsequently determined TMU for the MSUT is still substantially different from the MSUT uncertainty used, the linear regression may be repeated with each new estimate of the TMU substituted for the MSUT uncertainty ($U_{MSUT}$) in the ratio variable $\lambda$ (Eq. 5) until sufficient convergence of the MSUT uncertainty ($U_{MSUT}$) and TMU is achieved to declare a self-consistent result.

It should also be recognized that, depending upon the skill with which this method is executed and the nature of the measurement techniques used by the two systems, there may be an undesirable contribution from the artifact itself. Properly designed applications of this method should minimize or eliminate this contribution.

TMU provides a more correct estimate of the MSUT uncertainty than the precision estimate alone because it addresses the case where there are errors due both to precision and accuracy. In contrast, the Mandel linear regression method alone addresses situations where both variables are only subject to the instrument precisions. Accordingly, TMU is a more objective and comprehensive measure of how the MSUT data deviates from the ideal behavior that would generate a straight-line SL plot in FIG. 1, or the inability of the MSUT to measure accurately. It should be recognized, however, that there are differences between TMU and what is generally considered as measurement error, i.e., the quadratic sum of all possible sources of random and systematic error contributions. In particular, systematic errors due to magnification calibration errors and offset errors are not included in the TMU since, in principle, these can be reduced to arbitrarily small contributions given sufficient attention to calibration. TMU represents the limit of what can be achieved for the given type of measurement if sufficient attention is paid to calibration. As a consequence, it represents a measure of the intrinsic measurement worth of the system.

II. Assessment Method

With reference to FIGS. 2-6, a method and program product for assessing a measurement system under test (MSUT) will be described.

Figure 2A:
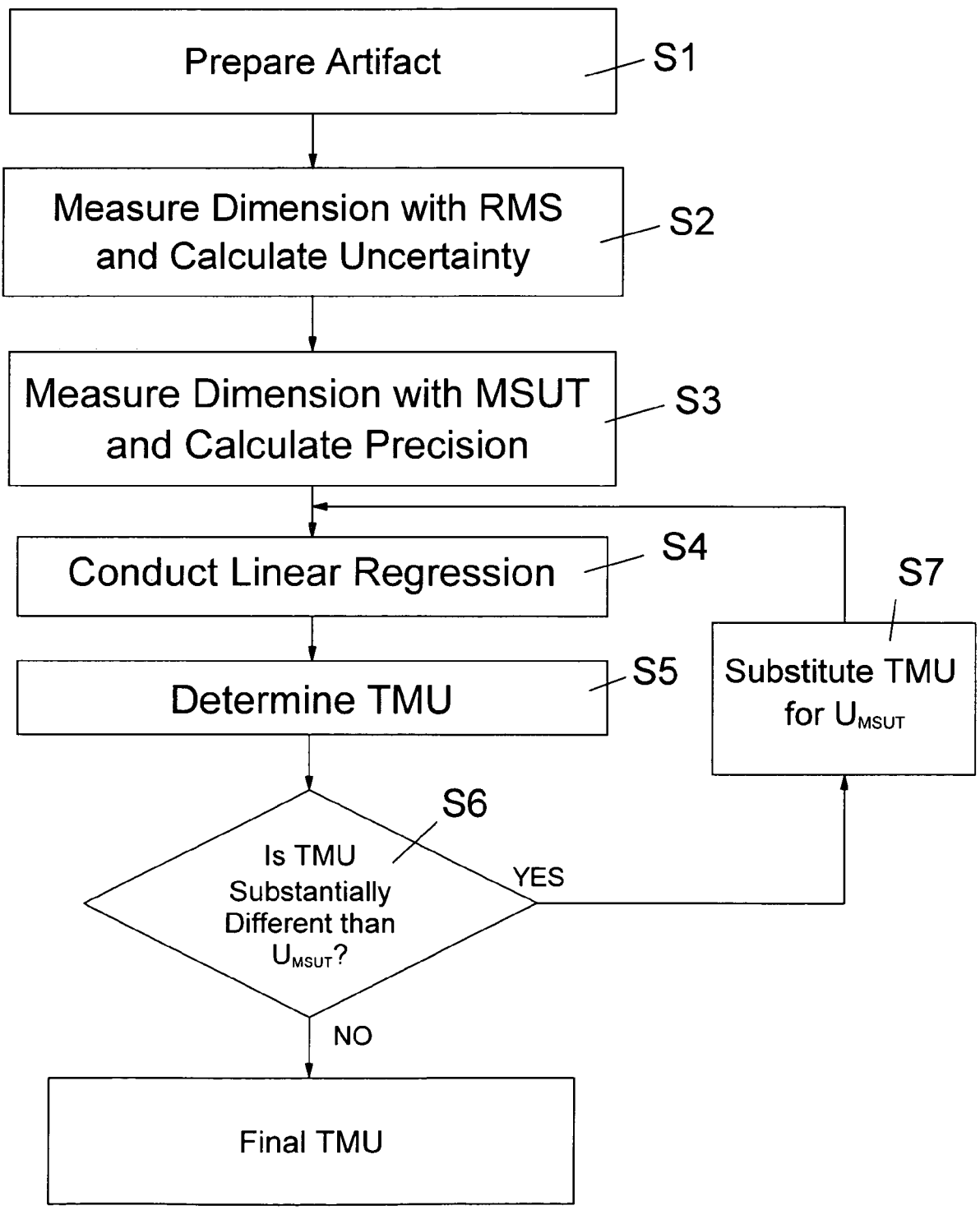
FIGS. 2A-B show flow diagrams of assessment method embodiments of the invention.

Referring to FIG. 2A, a flow diagram of a method for assessing a MSUT according to a first embodiment is shown.

Figure 3:
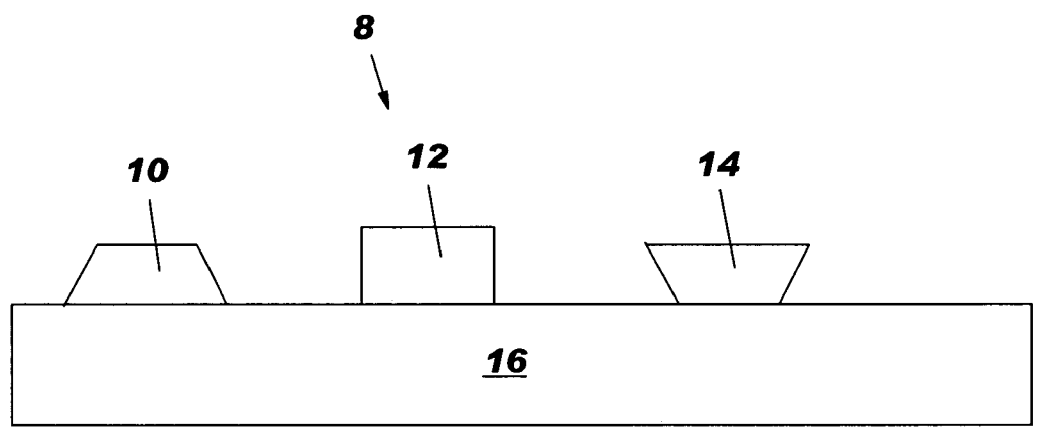
FIG. 3 shows multiple cross-sectional views of an artifact for measurement.

In a first step S1, an artifact for use in assessing the MSUT is prepared. With reference to FIG. 3, "artifact" as used herein shall refer to a plurality of structures 8 provided on a substrate 16. An artifact is generated to represent variations in a particular semiconductor process of interest for the particular MSUT. In one embodiment, an artifact may be process-stressed samples derived from actual product. FIG. 3 illustrates exemplary structures for a particular process including: an under-exposed structure 10, an ideal structure 12 (referred to as the "process of record" (POR) structure), and an overexposed undercut structure 14. Artifact 8 should be constructed to include a fair representation of all of the various scenarios that can arise during manufacturing. The types of artifact provided may vary drastically based on, for example, the type of measurement needing assessment, the manufacturing processes that alter the measurement, and measurement parameters that alter the measurement such as temperature, probe damage, manufactured product structure or materials, etc.

Returning to FIG. 2A, at step S2, a critical dimension of artifact 8 (FIG. 3) is measured using a reference measurement system (RMS) to generate an RMS data set. The dimension may include, for example, at least one of line width, depth, height, sidewall angle, top corner rounding or any other useful dimension. The RMS is any measuring system that is trusted within a particular industry or manufacturing process. The measurement step includes characterizing the artifact(s) and producing documentation detailing structure location and reference values. As part of this step, an RMS uncertainty ($U_{RMS}$) is calculated. This calculation may include calculation of an RMS precision ($\sigma_{RMS}$) according to any now known or later developed methodology, e.g., a standard deviation analysis. Alternatively, this calculation may include calculating a $TMU_{RMS}$ according to the methods disclosed herein. That is, the RMS may be treated as an MSUT and compared to another RMS.

At step S3, the same dimension is measured using the MSUT to generate an MSUT data set. This step includes conducting a long-term reproducibility (precision) study of the MSUT according to any now known or later developed methodology. As part of this step, a MSUT precision $\sigma_{MSUT}$ from the MSUT data set is also calculated according to any now known or later developed methodology, e.g., a standard deviation analysis.

Referring again to FIG. 1, a plot of data measured by an MSUT in the form of a CD SEM versus an RMS in the form of an AFM is shown. As discussed in the data analysis section above, if a MSUT is a perfect measuring tool, the data sets should generate a straight line (SL in FIG. 1) when plotted against one another, i.e., y=x. That is, the line should have unity slope and an intercept at 0 as generated by identical data points. However, a MSUT is never a perfect measuring tool because it and the artifact are subject to the myriad of process variations. In most instances, a 0 intercept or unity slope are unlikely and, even worse, may have peaks or curvature in the data. All of this represents inaccuracy in the MSUT.

Steps S4-S5 (FIG. 2A) represent calculations of a total measurement uncertainty (TMU) of the MSUT according to the above-described data analysis. In a first part, step S4, a Mandel linear regression, as discussed above, of the MSUT and RMS data sets is conducted. The Mandel linear regression produces the parameters of slope, net residual error of the MSUT (i.e., the MSUT data set compared to the RMS data set), corrected precision of the MSUT and average offset.

Next, at step S5, TMU is determined according to the formula:

$$TMU = \sqrt{D_M^2 - U_{RMS}^2} \quad (17)$$

where $D_M$ is the Mandel net residual error (Eq. 12) and $U_{RMS}$ is the RMS uncertainty, i.e., the RMS precision ($\sigma_{RMS}$) or an independently determined $TMU_{RMS}$. In other words, a TMU for the MSUT is determined by removing the RMS uncertainty ($U_{RMS}$) from the net residual error $D_M$.

At step S6, a determination is made as to whether the determined TMU is substantially different from the MSUT uncertainty ($U_{MSUT}$). In a first cycle of steps S4-S5, the MSUT uncertainty is the corrected precision. In subsequent cycles, the MSUT uncertainty is a previously determined TMU value of the MSUT. If step S6 results in a YES, as discussed above, the Mandel linear regression may be repeated with the previously determined TMU value substituted for the MSUT uncertainty (step S7) ($U_{MSUT}$) in the ratio variable λ (Eq. 5). The Mandel linear regression analysis is preferably repeated until a sufficient convergence of the MSUT uncertainty ($U_{MSUT}$) and TMU is achieved to declare a self-consistent result. What amounts to "sufficient convergence" or "substantially different" can be user defined, e.g., by a percentage.

If the determination at step S6 is NO, then the determined TMU value is considered the final TMU for the MSUT, i.e., sufficient convergence has occurred. Based on the final TMU, an objective assessment of the MSUT is achieved.

Figure 2B:
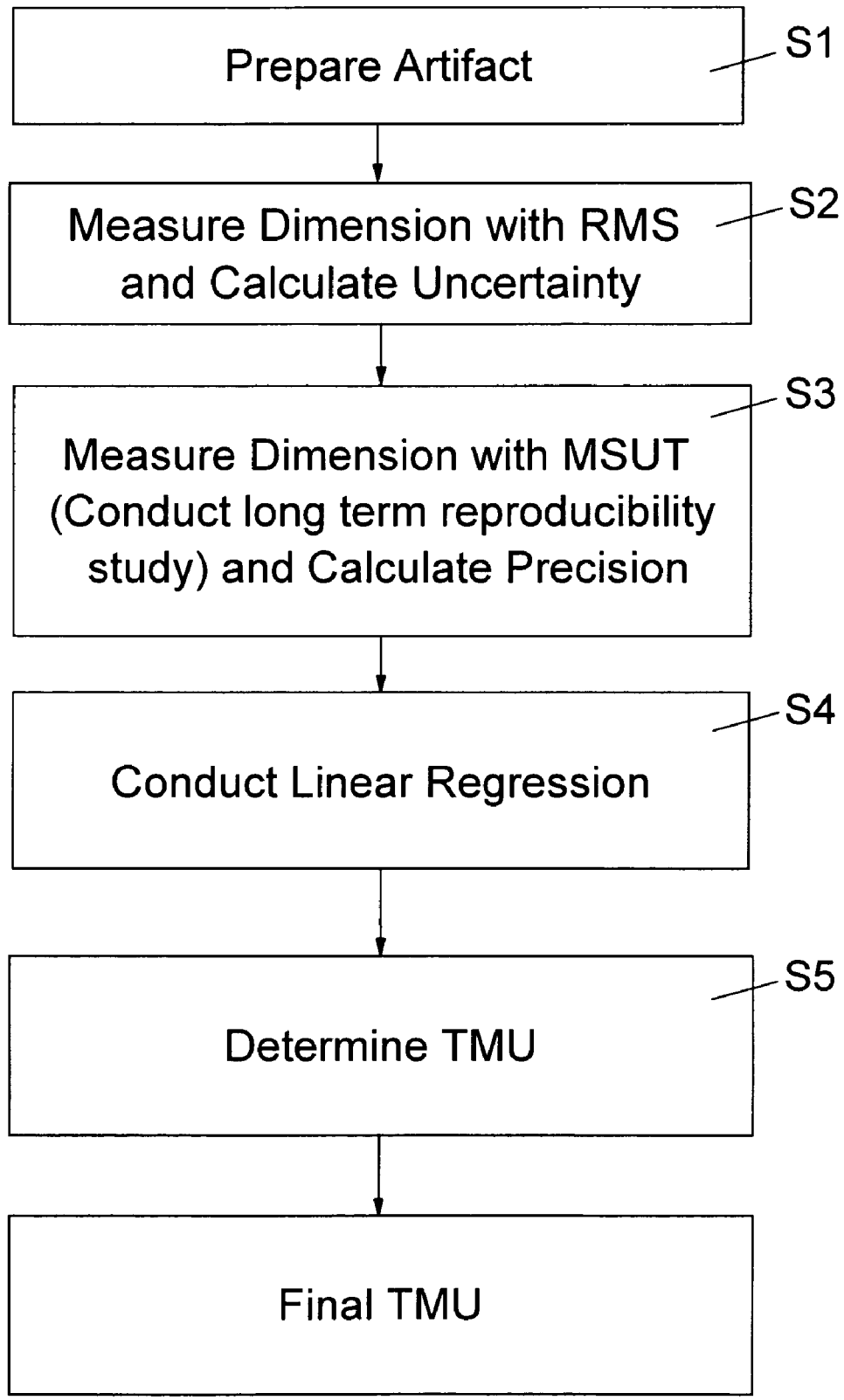

Referring to FIG. 2B, a flow diagram of a method for assessing a MSUT according to a second embodiment is shown. This embodiment is substantially similar to the embodiment of FIG. 2A, except that the linear regression can be any general linear regression, e.g., an OLS. In this case, the TMU is defined according to the formula:

$$TMU = \sqrt{D^2 - U_{RMS}^2} \quad (18)$$

where D is the net residual error (Eq. 11) and $U_{RMS}$ is the RMS uncertainty, i.e., the RMS precision ($\sigma_{RMS}$) or an independently determined $TMU_{RMS}$. The determined TMU in step S5 is the final TMU.

ASSESSMENT EXAMPLE

Figure 4:
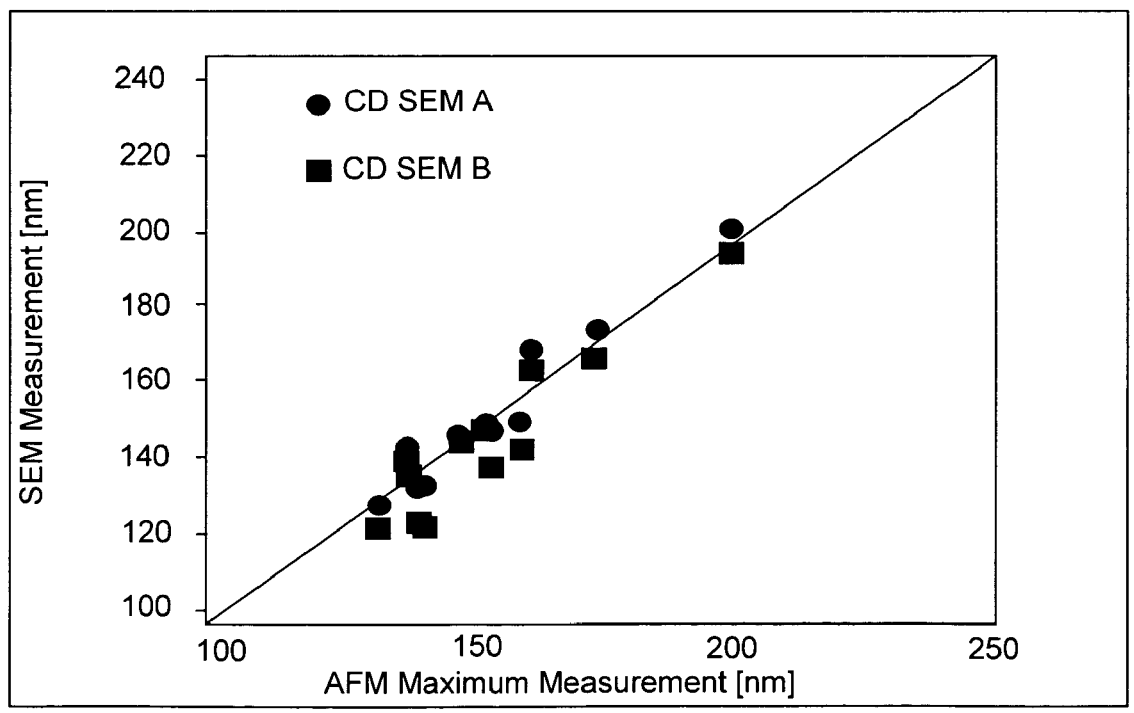
FIG. 4 shows a graph of data for a couple of CD scanning electron microscopes (SEM) under test versus an atomic force microscope (AFM) reference measurement system.

Referring to FIG. 4, a graph that compares measurements from two CD SEMs (CD SEM A and CD SEM B) to a respected RMS is shown. The artifact used was a focus and exposure matrix (FEM) wafer with the maximum dimension of an isolated line of resist as the feature of interest. This is a particularly important geometry and material because it is similar to a key semiconductor processing step that determines the speed with which transistors can switch. Hence, tighter and more accurate control at this step of manufacturing can produce more computer chips that are extremely fast and profitable. The RMS in this case was an atomic force microscope (AFM), which was trusted to determine the true CD, namely the maximum linewidth of the resist.

Ideally this data should lie along a straight line with unity slope and zero offset. The nonlinearity (Eq. 14) parameter characterizes the scatter of the data around the best-fit line. This variance of scatter is normalized so that if all of this variance is due to the random measurement variance measured by reproducibility, then the nonlinearity equals unity. In this case, CDSEM A has a nonlinearity of 100 while CDSEM B has a value of 137. Both are disturbingly large numbers. The following table derived from this data further illustrates the improved objectivity of the TMU parameter.

|  | Corrected Precision [nm] | Total Measurement Uncertainty [nm] |
| --- | --- | --- |
| CDSEM A | 1.5 | 20.3 |
| CDSEM B | 1.8 | 26.1 |

Figure 5:
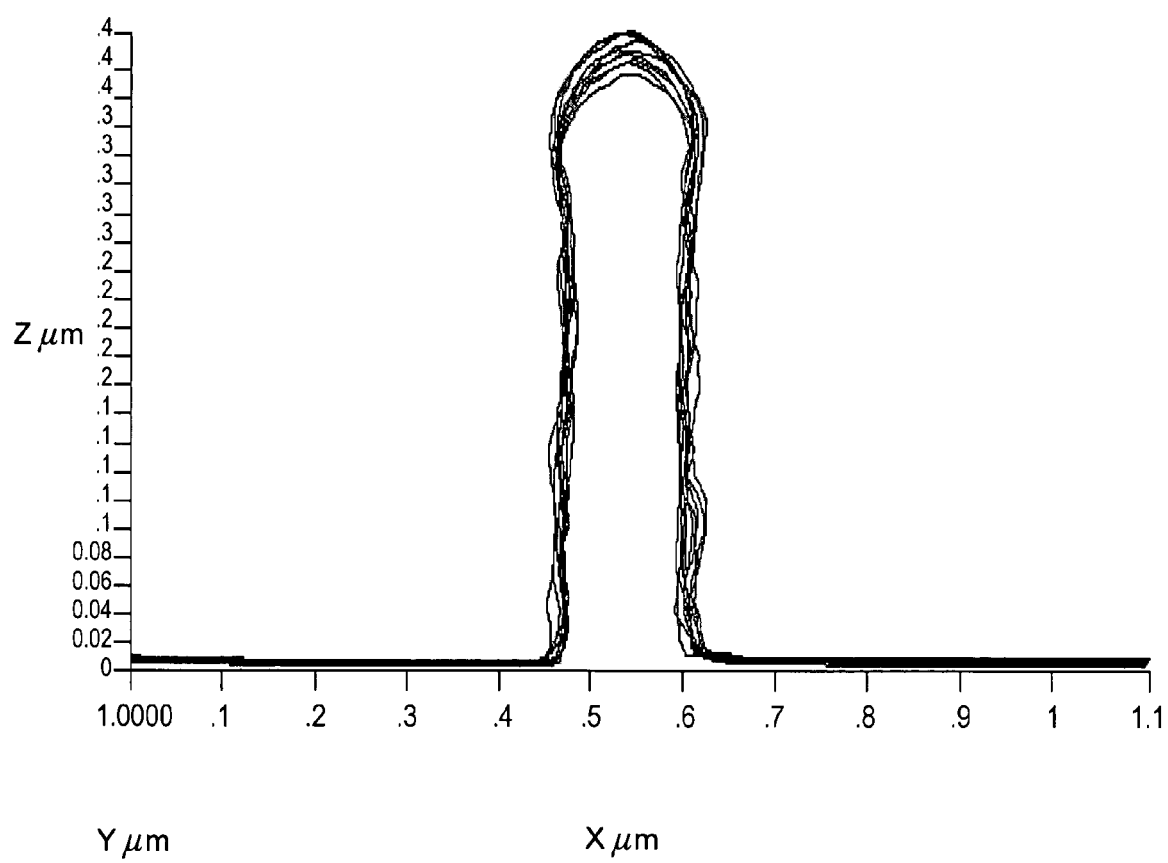
FIG. 5 shows AFM images for one feature of an artifact.
Figure 6:
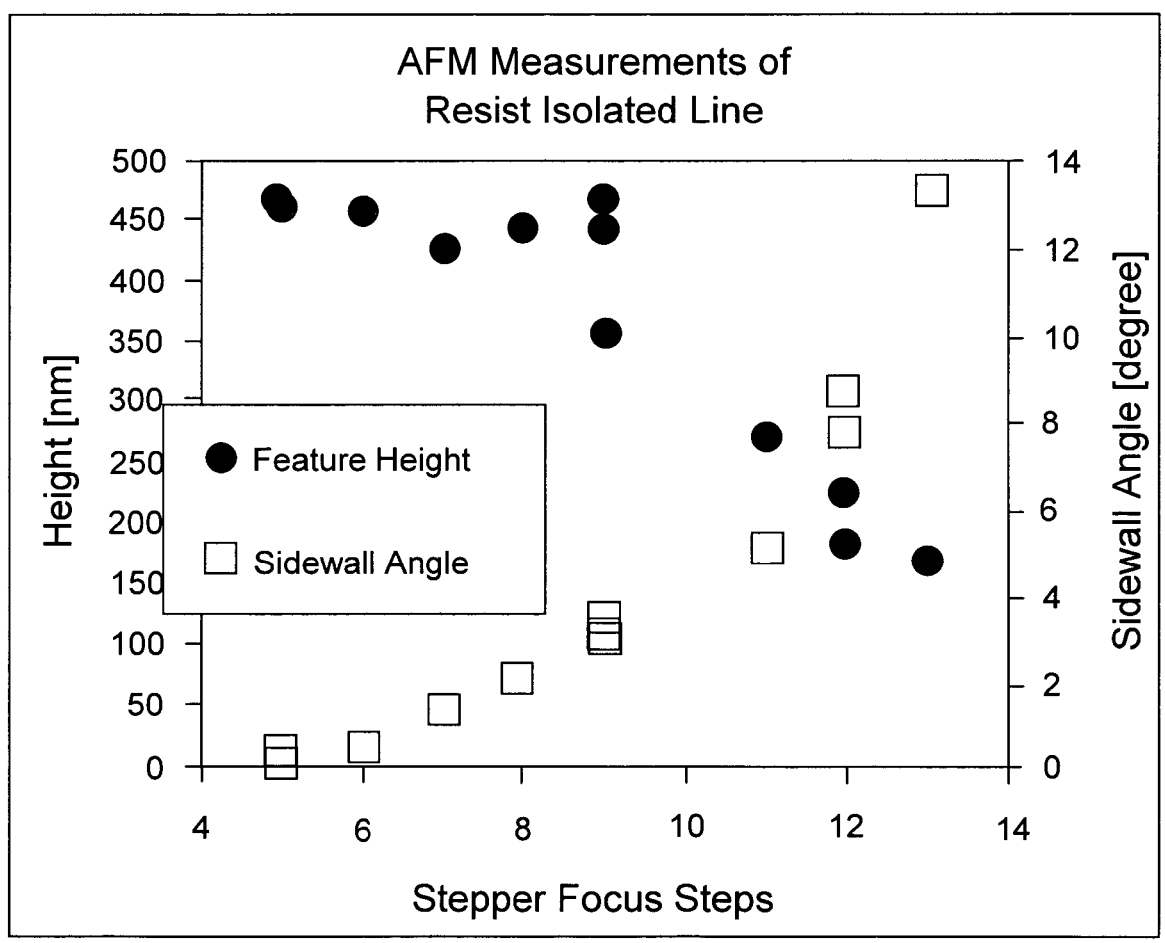
FIG. 6 shows a graph of variation in feature height and sidewall angle across the various features through photolithographic stepper focus and dose.

This example illustrates the severe discrepancy between using precision as the key roadmap parameter and TMU, which contains precision but also includes contributions from accuracy. In the particular example of the resist-isolated line, the problem is associated with severe resist loss during the printing process, which can have profound changes to the line shape, and how well the MSUT measures the desired critical dimension. FIG. 5 shows multiple AFM images for one of the features on this FEM wafer. The AFM image shows edge roughness, top corner rounding, and even undercut. Referring to FIG. 6, a graph shows the variation in feature height and sidewall angle across the FEM. On the horizontal axis is the photolithographic stepper focus setting. Across this FEM, the feature height changes by a factor of three (3). In addition, there is significant sidewall angle variation.

III. Optimization Method

An application for the above-described assessment methodology and TMU calculation lies in the optimizing of a measurement system. Conventional methods for optimizing a MSUT would seek measurement conditions and algorithm settings to minimize the precision and offset of the measurement. Minimization of TMU as described above, however, provides a more objective and comprehensive determination.

Figure 7A:
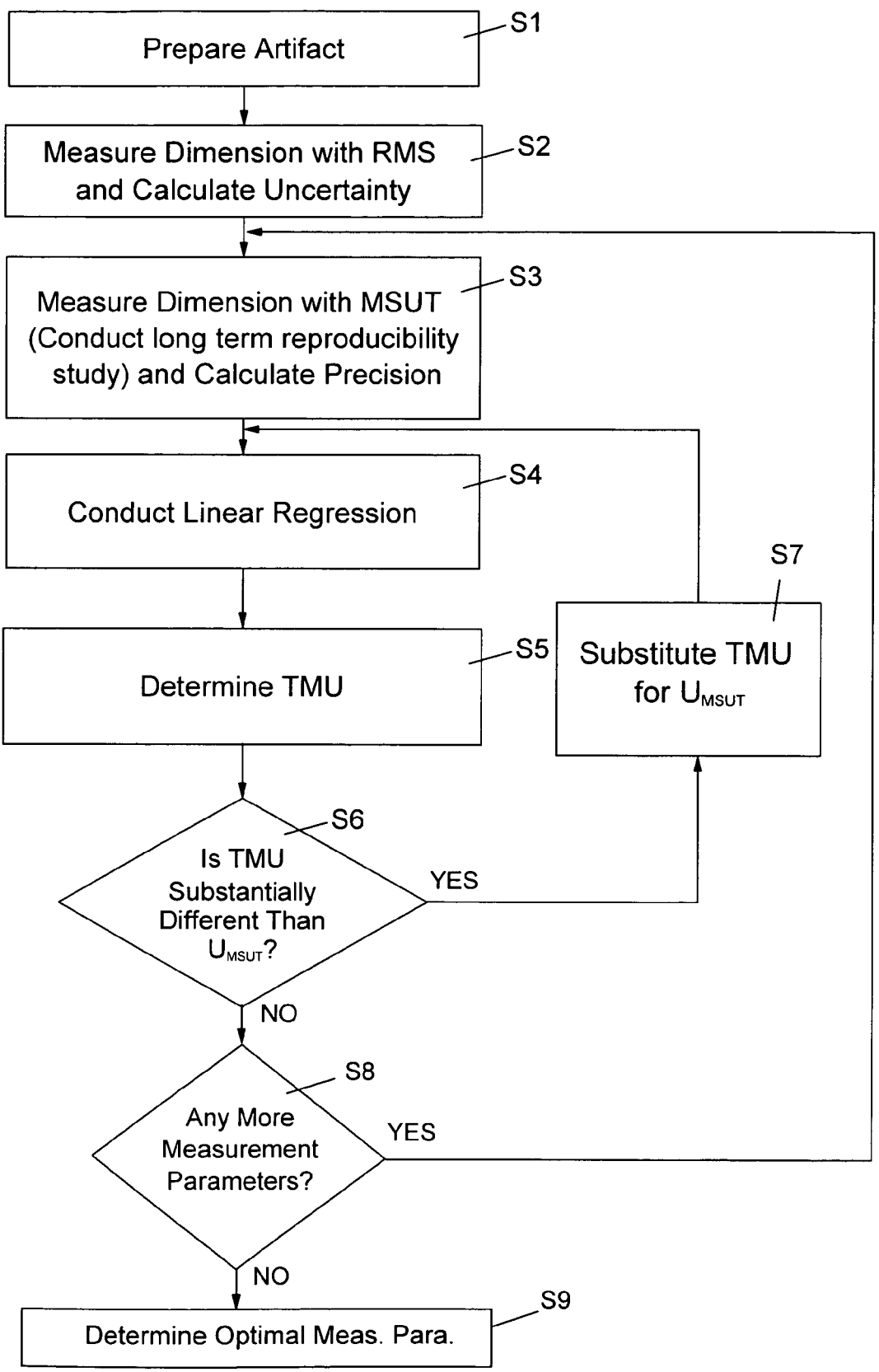
FIGS. 7A-B show flow diagrams of optimization method embodiments of the invention.

Turning to FIG. 7A, a flow diagram of a method of optimizing an MSUT according to a first embodiment is shown. In first step, S1, a structure 8 (FIG. 3), i.e., artifact, is provided as described above relative to the assessment method.

Step S2 (FIG. 7A) includes measuring a dimension of the plurality of structures according to a measurement parameter using a reference measurement system (RMS) to generate an RMS data set. A "measurement parameter" as used herein, refers to any measurement condition or analysis parameter that affects the outcome of the measurement that can be controllably altered. A "measurement parameter" may also include a combination of conditions and parameters or a variation of one of these. Measurement parameters may vary, for example, according to the type of MSUT. For example, for an SEM, a measurement parameter may include at least one of: a data smoothing amount, an algorithm setting, a beam landing energy, a current, an edge detection algorithm, a scan rate, etc. For a scatterometer, a measurement parameter may include at least one of: a spectra averaging timeframe, a spectra wavelength range, an angle of incidence, area of measurement, a density of selected wavelengths, number of adjustable characteristics in a theoretical model, etc. For an AFM, a measurement parameter may include at least one of: a number of scans, a timeframe between scans, a scanning speed, a data smoothing amount, area of measurement, a tip shape, etc. A step of selecting a measurement parameter(s) (not shown) may also be included in the optimization method. Subsequently, an RMS uncertainty ($U_{RMS}$) is calculated. This calculation may include calculation of an RMS precision ($\sigma_{RMS}$) according to any now known or later developed methodology, e.g., a standard deviation analysis. Alternatively, this calculation may include calculating a $TMU_{RMS}$ according to the methods disclosed herein. That is, the RMS may be treated as an MSUT and compared to another RMS.

In next step, S3, measurement of the same dimension of the plurality of structures according to the same measurement parameter using the MSUT is made to generate an MSUT data set. Subsequently, a precision of the MSUT from the MSUT data set is calculated.

Step S4 includes, as described above relative to the assessment method, conducting a Mandel linear regression analysis of the MSUT and RMS data sets to determine a corrected precision of the MSUT, and a net residual error for the MSUT.

Next, at step S5, TMU is determined according to the formula:

$$TMU=\sqrt{D_M^2-U_{RMS}^2} \qquad (19)$$

where $D_M$ is the Mandel net residual error (Eq. 12) and $U_{RMS}$ is the RMS uncertainty, i.e., the RMS precision ($\sigma_{RMS}$) or an independently determined $TMU_{RMS}$. In other words, a TMU for the MSUT is determined by removing the RMS uncertainty ($U_{RMS}$) from the net residual error $D_M$.

At step S6, a determination is made as to whether the determined TMU is substantially different from the uncertainty for the MSUT ($U_{MSUT}$). As noted above, in a first cycle of steps S4-S5, the MSUT uncertainty is the corrected precision. In subsequent cycles, the MSUT uncertainty is a previously determined TMU value of the MSUT. If step S6 results in a YES, as discussed above, the Mandel linear regression may be repeated with the previously determined TMU value substituted for the MSUT uncertainty ($U_{MSUT}$) (step S7) in the ratio variable λ (Eq. 5). The Mandel linear regression analysis is preferably repeated until a sufficient convergence of the MSUT uncertainty ($U_{MSUT}$) and TMU is achieved to declare a self-consistent result. What amounts to "sufficient convergence" or "substantially different" can be user defined, e.g., as a percentage.

If the determination at step S6 is NO, then the determined TMU is considered the final TMU for that measurement parameter, and processing proceeds to step S8.

At step S8, a determination is made as to whether another measurement parameter (e.g., CD SEM smoothing filter adjustment) exists. If step S8 results in YES, steps S3 to S7 may be repeated for another measurement parameter. The repeating step may recur for any number of measurement parameters. The resulting data includes a number of TMUs with corresponding measurement parameter(s) and/or artifact structure(s). If step S8 results in NO, processing proceeds to step S9.

Step S9 includes optimizing the MSUT by determining an optimal measurement parameter based on a minimal TMU. In particular, a minimal TMU is selected from a plurality of total measurement uncertainties of a corresponding plurality of measurement parameters. The corresponding measurement parameter represents the least imprecise and inaccurate environment for using the MSUT.

Figure 7B:
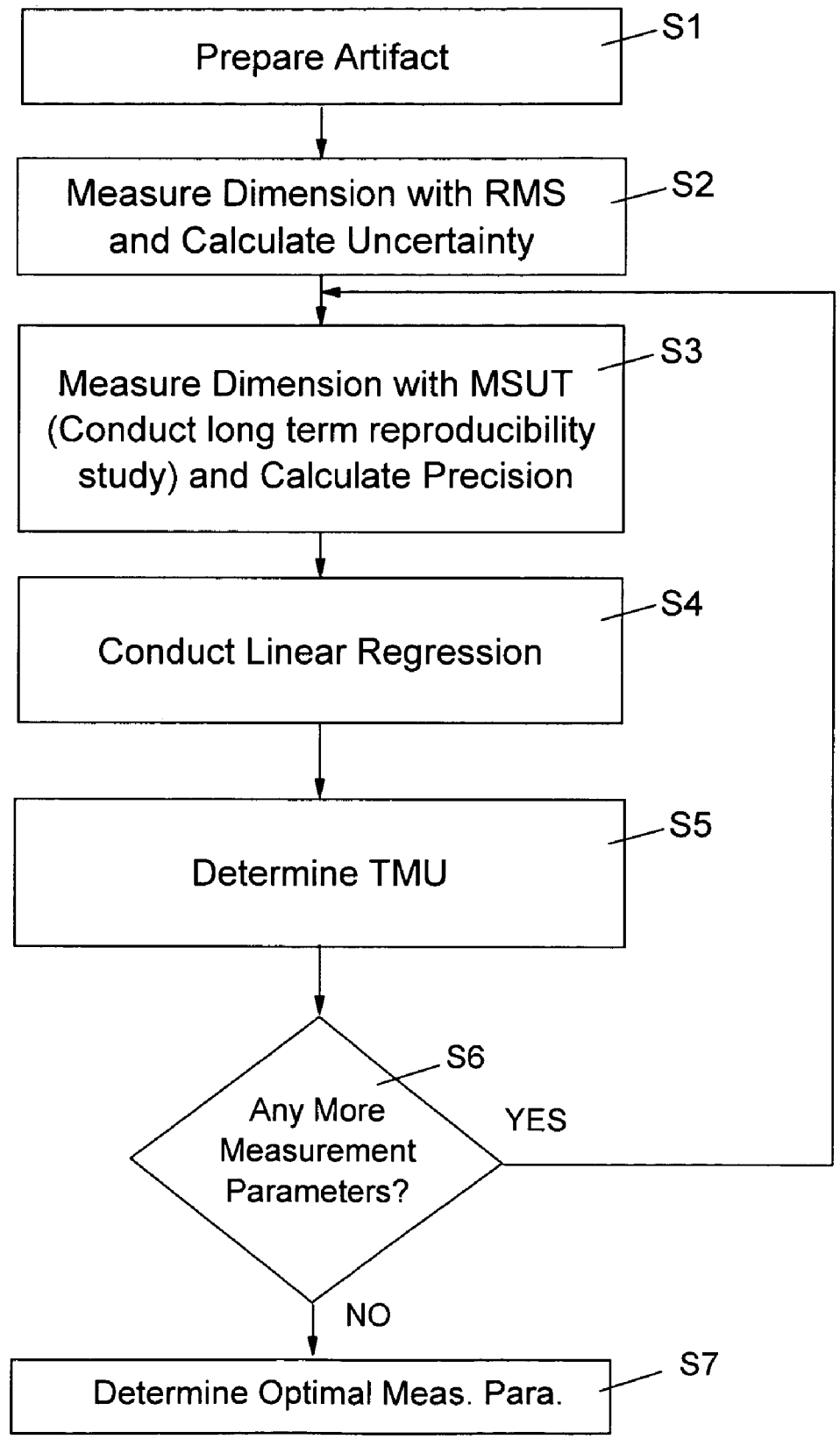

Referring to FIG. 7B, a flow diagram of a method for optimizing a MSUT according to a second embodiment is shown. This embodiment is substantially similar to the embodiment of FIG. 7A, except that the linear regression can be any general linear regression, e.g., an OLS. In this case, the TMU is defined according to the formula:

$$TMU=\sqrt{D^2-U_{RMS}^2} \qquad (20)$$

where D is the net residual error (Eq. 11) and $U_{RMS}$ is the RMS uncertainty, i.e., the RMS precision ($\sigma_{RMS}$) or an independently determined $TMU_{RMS}$. In addition, the determined TMU for a measurement parameter in step S5 is considered the final TMU for that particular measurement parameter. Step S6 and S7 are identical to steps S8 and S9 relative to the description of FIG. 7A.

OPTIMIZATION EXAMPLE

Figure 8:
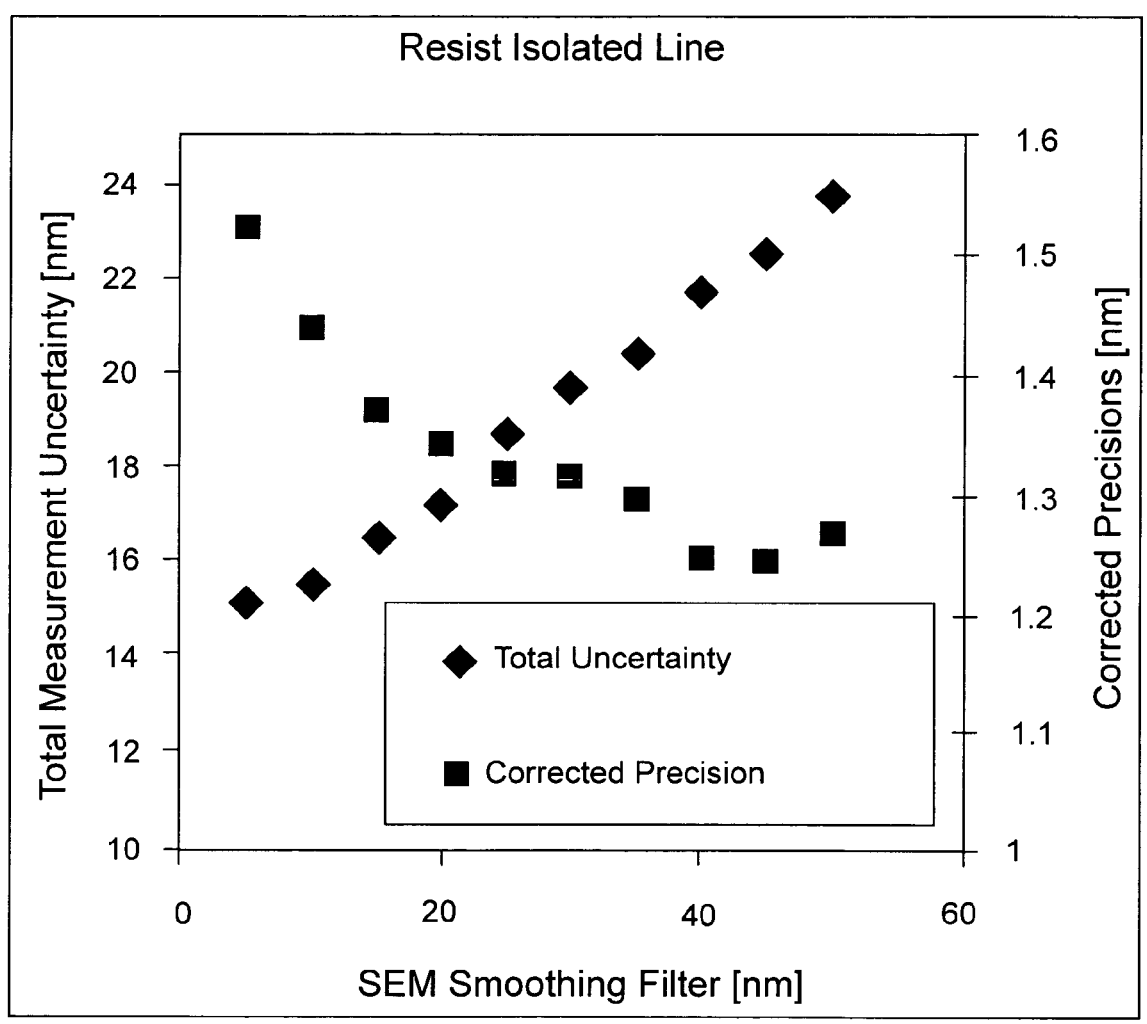
FIG. 8 shows a graph of total measurement uncertainty and corrected precision versus an amount of SEM data smoothing from the optimization process shown in FIGS. 7A-B.

Referring to FIG. 8, an example derived from optimizing measurement conditions on a CDSEM for a resist isolated line geometry is graphically illustrated. The CD SEM starting conditions were those of one of the CD SEMs discussed earlier. While several acquisition conditions and algorithms settings were optimized in this investigation, the graph shown in FIG. 8 illustrates the consequences of changing the amount of smoothing done to the raw CD SEM waveform prior to further algorithm analysis. In particular, the noise reduction from this smoothing has a positive effect upon reducing the corrected precision. However, from the point of view of TMU, the trend is opposite. This suggests that the loss of accuracy in tracking the process changes in the artifact is worse with greater smoothing as evidenced by this trend dominating the TMU.

IV. Improved Reference Measurement System Uncertainty $U_{RMS}$ Calculation

The above-described methodology for determining total measurement uncertainty (TMU) is proposed as an improved method of assessing and optimizing metrology instruments. TMU analysis provides the correlation slope, the TMU, and the average offset. While the previous work with TMU analysis uses a general description of uncertainty of the RMS ($U_{RMS}$), the known approaches to uncertainty of the RMS are not adequate where the measurement uncertainty of the MSUT is reduced to a level approaching or below that of the RMS. Thus, improved methods of characterizing the uncertainty of the RMS ($U_{RMS}$) to enhance the utility of TMU analyses are also needed.

The $U_{RMS}$ is made up of both systematic and random error components. The systematic errors are often difficult to determine. Those systematic errors that can be determined should be removed from the $U_{RMS}$ (e.g., by tool calibration). A proper construction of the RMS assumes that the systematic errors have been removed. Accordingly, improvements in determining $U_{RMS}$ should focus on just the random error component of the $U_{RMS}$. If the letter "V" represents a variance, the random components of the $U_{RMS}$ include:

1. The short term precision/repeatability component $V_{ST}$;
2. The across grating variation component $V_{AG}$;
3. The "multiple reference measurement system" component $V_{MRMS}$; and
4. The long term precision/repeatability component $V_{LT}$.

Although $V_{AG}$ is not technically a part of the $U_{RMS}$, TMU analysis dictates that it must be associated either with the MSUT or the RMS. Because the TMU is meant to be a measure of how well the MSUT measures, $V_{AG}$ is assigned to the $U_{RMS}$.

The $U_{RMS}$, when expressed as a variance, may be just $V_{URMS}=V_{ST}+V_{AG}$, or may include all of the variances as:

$$V_{URMS}=V_{ST}+V_{AG}+V_{MRMS}+V_{LT}.$$

A. Short Term Precision and Across-Grating Variation Components

It is often best to determine the short term precision and across-grating variation components together without separating them because, when making a reference measurement using non-unique pattern recognition, both of these components affect the measurement. In order to determine them, three questions must be answered:

a) How will the data be compared (by chip average, by wafer average, or by lot average)?
b) How many measurements per grating were made (one or multiple)?
c) How does the process vary from one wafer to the next?

There are three common ways that data can be compared in a correlation plot. The first way involves averaging all RMS measurements across a grating and plotting these averages against the grating averages from the MSUT. Usually only one grating of a given type is measured per chip; in this case, this type of correlation plot is called a "by chip" plot. If multiple identical gratings are measured on each chip, each grating could be considered a separate chip; this correlation plot would still be considered a "by chip" plot. When all measurements from a grating type are averaged across a wafer so that each point in the plot represents a wafer average, the correlation plot is called a "by wafer" plot. Similarly, averaging measurements across a lot yields a "by lot" comparison. Different comparisons are useful in different ways. For example, "by wafer" comparisons are more useful than the others when doing wafer feedforward analysis. "By lot" comparisons may be best in manufacturing if the wafers in a lot measured by the RMS are not necessarily the same as those measured by the MSUT.

The second consideration when determining $V_{ST}+V_{AG}$ is how many measurements per grating were made. The method for determining $V_{ST}+V_{AG}$ is fundamentally different depending on whether one or multiple measurements are made. However, this method does not depend on whether the RMS uses a microscopic sampling technique (e.g., a CD-SEM or AFM) or a macroscopic sampling technique (e.g., a scatterometer). When multiple measurements are made, the microscopic sampling should be spread across the grating in order to properly capture the across-grating variation component. Multiple measurements (two or more) are preferred, as the associated calculation is a little easier, and the resulting estimate for $V_{ST}+V_{AG}$ is more accurate.

The last consideration depends on the wafer processing. As will be described below, wafers that were nominally processed the same for all processes that may affect the measurements can be grouped together to aid in the calculation of $V_{ST}+V_{AG}$. Of course, no two wafers are processed exactly the same due to subtle, uncontrollable process variations, but the more similarly they are processed, the better the determination of $V_{ST}+V_{AG}$. Process variations can be caused, for example, by intentional variations in the etch process or film stack. When evaluating a process variation to determine whether it is significant, the critical question to ask is: "Does this process affect the measurements across the wafer as it is varied from one wafer to the next?" For example, etch process "A" may have better center-to-edge uniformity than etch process "B." This means that wafers processed with one of these etches should be conceptually separated from wafers processed with the other etch. The reasoning for this will be explained below.

Answers to the three questions above are used to determine how $V_{ST}+V_{AG}$ is calculated. But before this calculation is described, the variables that are used in the calculation need to be defined, which are shown in Table 1. Table 2 summarizes methods for determining the component $V_{ST}+V_{AG}$ of the $U_{RMS}$ for many situations.

Consider case #1. Here, a "by chip" analysis is desired, and multiple measurements have been collected from the grating using the RMS. The short term precision and across-grating components can be calculated by first determining the variance of all the measurements made on grating "i." A variance is calculated for each grating, ending with a total of $N_C$ variances (one for each chip). This assumes that only one grating of a given type per chip is measured. These variances are then averaged (hence the summation and the division by $N_C$). The average variance is then divided by $n_G$, the number of measurements per grating. This is done because the more measurements that are collected across the grating, the smaller the uncertainty in the RMS becomes. Note that case #1 is independent of the variation of wafer processing because it is assumed that the wafer processing does not affect the across-grating variation.

TABLE 1

Definition of variables used to calculate $V_{ST} + V_{AG}$.

$s_{Gi}$ = set of all measurements across grating i
$\bar{y}_{Wj}$ = average of all measurements across wafer j
$s_{DCk}$ = set of all measurement differences from the wafer average $\bar{y}_{Wj}$ for chip k from all wafers
$V(s)$ = variance of the set s
$n_G$ = number of measurements/grating
$n_C$ = number of measured chips/wafer
$n_W$ = number of measured wafers/lot
$N_L$ = total number of lots
$N_C = n_C \times n_W \times N_L$ = total number of measured chips
$N_W = n_W \times N_L$ = total number of measured wafers Case #2 also involves "by chip" analysis, but now only one measurement per grating was made. Determining the variance of a single measurement is impossible, so the across-grating variation must be captured in a different way. To do this, measurements from different gratings must be carefully combined into sets so that across-wafer and wafer-to-wafer variation is not inadvertently captured. To avoid capturing across-wafer variation, only the measurements from the same chip across all wafers are grouped together. Taking the variance of each of these sets of measurements, however, still captures wafer-to-wafer variation. To avoid this, the average of all measurements across a wafer is calculated. For wafer "j" this average would be $\bar{y}_{Wj}$. Each measurement is then subtracted from its wafer average. The set of all of these measurement differences for chip "k" from all wafers is called $s_{DCk}$. Thus, taking the variance of $s_{DCk}$ avoids both across-wafer and wafer-to-wafer variation. The number of these variances equals the number of measured chips per wafer, $n_C$. Averaging these $n_C$ variances then determines $V_{ST}+V_{AG}$. This methodology essentially "pretends" that the measurements in each set $s_{DCk}$ come from the exact same grating. If the number of measured wafers, $N_W$, is one, each set includes only one number. Since it is meaningless to take the variance of these single-number sets, $V_{ST}+V_{AG}$ must instead be calculated in a separate exercise. It is noted that for case #2 there is no variation in the wafer processing. If there was such a variation, then chip "k" on one wafer may be treated differently relative to the wafer average than chip "k" on another wafer from a different process. This would add variation to $s_{DCk}$ that would depend on the wafer process, resulting in an artificially high variance.

Case #3 is similar to case #2, except that now there is some variation in the wafer processing. What is meant by this is that the wafers are now grouped so that wafers within a group were processed the same, but each group was processed differently. The groups need to have more than one wafer each in order for this to be considered case #3. The methodology used for case #2 is now used, but each wafer group is kept separate. That is, each set $s_{DCk}$ only spans measurements across wafers within a single group. One estimate of $V_{ST}+V_{AG}$ for each wafer group is then calculated. Using each of these estimates, a weighted average, according to the number of wafers in each group, is then computed to determine the final value of $V_{ST}+V_{AG}$.

Case #4 represents the situation where each wafer group includes only one wafer. Here, it is said that there is complete variation in the wafer processing. That is, each wafer is processed uniquely. When this occurs, each $s_{DCk}$ includes only one measurement, so the methodology described in cases #2 and #3 breaks down. Therefore, $V_{ST}+V_{AG}$ must be determined in a separate exercise.

Cases 5-8 are analogous to cases 1-4, except now the desired analysis is by wafer. The only difference in the calculation now is the extra division by $n_C$, the number of measured chips per wafer. This calculation is completed because the more chips that are measured per wafer, the better the determination of the $U_{RMS}$.

Cases 9-12 are used for "by lot" analysis, and are analogous to cases 5-8. The factor $(1/n_W)$ has been included because the more wafers that are measured per lot, the better the determination of the $U_{RMS}$.

TABLE 2

Strategies for calculating $V_{ST} + V_{AG}$, depending on intended analysis, sampling plan, and wafer processing.

| Case # | By chip, By wafer, or By lot | One or multiple meas./ grating | Variation of wafer process conditions: 1. none (constant) 2. some (wafer groups) 3. complete (each wafer unique) | $V_{ST} + V_{AG}$ |
|---|---|---|---|---|
| 1 | By chip | multiple | none, some, or complete | $\dfrac{1}{n_G N_C}\sum\limits_{i=1}^{N_C} V(s_{Gi})$ |
| 2 | By chip | one | none | $\dfrac{1}{n_C}\sum\limits_{k=1}^{n_C} V(s_{NCk})$ <br> If $N_W = 1$, determine $V_{ST} + V_{AG}$ separately. |
| 3 | By chip | one | some | Use results from case #2, except keep each wafer group separate. After determining the variance for each wafer group, the weighted average (according to # of wafers in each group) of these variances determines $V_{ST} + V_{AG}$. |
| 4 | By chip | one | complete | Determine $V_{ST} + V_{AG}$ separately. |
| 5 | By wafer | multiple | none, some, or complete | $\dfrac{1}{n_C n_G N_C}\sum\limits_{i=1}^{N_C} V(s_{Gi})$ |
| 6 | By wafer | one | none | $\dfrac{1}{n_C^2}\sum\limits_{k=1}^{n_C} V(s_{NCk})$ |
| 7 | By wafer | one | some | Use results from case #6, except keep each wafer group separate. After determining the variance for each wafer group, the weighted average (according to # of wafers in each group) of these variances determines $V_{ST} + V_{AG}$. |
| 8 | By wafer | one | complete | Determine $V_{ST} + V_{AG}$ separately. |
| 9 | By lot | multiple | none, some, or complete | $\dfrac{1}{n_W n_C n_G N_C}\sum\limits_{i=1}^{N_C} V(s_{Gi})$ |

TABLE 2-continued

Strategies for calculating $V_{ST} + V_{AG}$, depending on intended analysis, sampling plan, and wafer processing.

| Case # | By chip, By wafer, or By lot | One or multiple meas./ grating | Variation of wafer process conditions: 1. none (constant) 2. some (wafer groups) 3. complete (each wafer unique) | $V_{ST} + V_{AG}$ |
|---|---|---|---|---|
| 10 | By lot | one | none | $\dfrac{1}{n_W n_C^2} \sum_{k=1}^{n_C} V(s_{NCk})$ |
| 11 | By lot | one | some | Use results from case #10, except keep each wafer group separate. After determining the variance for each wafer group, the weighted average (according to # of wafers in each group) of these variances determines $V_{ST} + V_{AG}$. |
| 12 | By lot | one | complete | Determine $V_{ST} + V_{AG}$ separately. |

Special instances exist where the wafer processing may appear to be categorized as "some" or "complete," but is in fact "none." These instances are based on chip-level processing (e.g., lithography) rather than wafer-level processing (e.g., etch). One such instance is where different wafers receive different lithography doses or foci, but the dose and focus for each wafer is constant across that wafer. Exposing wafers at these different conditions is not expected to affect measurements across the wafer because these are chip-level processing conditions. Thus, any across-wafer variation differences between wafers exposed with a different dose or focus is not expected to be caused by these exposure conditions. Across-wafer variation differences would instead be caused by intentional wafer-level processing differences (e.g., etch) or by subtle, uncontrollable wafer-to-wafer processing differences.

Note that the methods described in table 2 use the reference measurements themselves to determine $V_{ST}+V_{AG}$. The advantage to this is that no additional measurements need to be made. However, when $V_{ST}+V_{AG}$ must be determined separately, additional measurements beyond the reference measurements are required. For this less-preferred method, multiple measurements across one or more gratings can be made. Then, the methods shown in case #1, #5, or #9 must be used.

B. "Multiple Reference Measurement Systems" (MRMS) Component

This variance component must be considered when more than one reference measurement system has been used in a correlation plot. By this, it is meant that the reference measurement systems are of the same type or model (e.g., the same type of CD-SEM or AFM). A composite RMS (e.g., CD-SEM, which has been calibrated by CD-AFM, which has been calibrated by TEM) is different and is not what is meant by "multiple reference measurement systems."

The best way to determine the MRMS component is to conduct a TMU calibration exercise between the RMS tools using either one or more wafers from the wafer set that is used for the TMU analysis, or using one or more wafers that are representative of the wafers used for the TMU analysis (i.e., the same application). Wafers used in this way are called "calibration wafers." Then multiple measurements across the wafer(s) of the exact same feature (using unique pattern recognition) must be made using all reference measurement systems used in the correlation plot. One system must then be identified as the "golden system." This can be any of the reference measurement systems, and does not have to be what is considered the "best" system. The easiest choice for the golden system is the one that is used most frequently in the correlation plot. Finally, using TMU analysis, all measurements from non-golden systems should be converted to golden-system-equivalent measurements. This does not determine $V_{MRMS}$ per se, but does properly take into consideration the use of multiple reference measurement systems, and eliminates the need to calculate an actual value for $V_{MRMS}$.

If it is inconvenient to conduct this calibration exercise for all RMSs, an alternative is offered which provides an estimate for $V_{MRMS}$. To determine this estimate, first measure the calibration wafer(s) on two different reference measurement systems; ideally, one should be the golden system. Use TMU analysis to determine the TMU and average offset between the systems. Note that the analysis should be iterated so that the $U_{RMS}$ and TMU are equal at the end of the iterative process. This iterative analysis is done because the reference measurement systems are the same type, and so the uncertainty should be shared equally between them. The next step is to convert the TMU to a variance by dividing by three, then squaring. This variance will be denoted $V_{TMU\_MRMS}$. Next, the average offset must be squared. This number, which has the same units as a variance, will be denoted $V_{AVG\_MRMS}$. If it is at least known that all of the other RMSs measure in a "similar" manner to the non-golden system that was calibrated, then it can be assumed (estimated) that they would have a similar TMU and average offset as the calibrated system, when compared to the golden system. The accuracy of this estimate relies on how well the other RMSs are matched to the calibrated non-golden system. When this assumption is true, $V_{MRMS}$ can be estimated as $$V_{MRMS} = V_{TMU\_MRMS} + V_{AVG\_MRMS}. \qquad (2)$$

Note that only one $V_{MRMS}$ should be calculated; there is not a $V_{MRMS}$ for each RMS. Because measurements made on the non-golden calibrated system can be "converted" to golden-system measurements, while equation (2) is helpful when some measurements are made on the uncalibrated systems, care must be used when using this methodology. Different ratios for the number of measurements collected on each type of RMS affect how this methodology is used. For example, if 10% of the measurements are collected on the golden system, 80% on the non-golden calibrated system, and 10% on uncalibrated systems, the methodology could be implemented differently than if the second and third percentages are switched.

C. Long Term Precision Component

The long term precision component is only relevant and present if the reference measurements have been taken over a long period of time. Furthermore, if multiple RMSs are used, the long term precision component is only relevant and present if the reference measurements from a given RMS have been taken over a long period of time. That is, if the measurements from each RMS are made over a short period of time, but the time period between when the first and last RMSs are used is long, then the long term precision component is not needed.

To determine $V_{LT}$, two exercises must be completed. The first is to determine the short term precision component ($V_{ST}$) directly and independently of $V_{AG}$. To do this, repeated measurements using unique pattern recognition must be collected on a relevant structure from the calibration wafer(s) over a short period of time. Then $V_{ST}$ can be calculated from these data using standard techniques.

The second exercise is identical to the first, except that the measurements are made over a long period of time (similar in scope to the period used to collect the actual reference data). Since these measurements are affected by both short and long term precision, the variance $V_{ST\_LT}$ that is derived using standard techniques is just $$V_{ST\_LT} = V_{ST} + V_{LT} \quad (3)$$

Since $V_{ST}$ was already determined in the first exercise, $V_{LT}$ can easily be calculated:

$$V_{LT} = V_{ST\_LT} - V_{ST} \quad (4)$$

D. Display of TMU Results

The $U_{RMS}$ determination techniques described above are advantageous to achieve an accurate TMU estimate when the TMU is close to or less than the $U_{RMS}$. Therefore, given extremely small TMUs, the $U_{RMS}$ methodology may be used in all TMU analyses.

Another improvement to TMU analysis is described by Sendelbach et. al. and involves the use of TMU error bars. M. Sendelbach et al, "Correlating Scatterometry to CD-SEM and electrical gate measurements at the 90 nm mode using TMU analysis", Proceedings of SPIE, Vol. 5375, Metrology, Inspection, and Process Control for Microlithography XVIII, Editor, Richard M. Silver, pp. 550-563, 2004. This technique estimates the uncertainty with which a TMU result is calculated by providing an upper and lower estimate for TMU. The results shown use this technique with TMU uncertainty bounds determined using a confidence level of 90%.

V. Uncertainty of Total Measurement Uncertainty (TMU)

The TMU is derived from two quantities, the measurement uncertainty of the reference measurement system $U_{RMS}$ and the net residual error coming from the Mandel analysis $D_M$, according to the following equation:

$$\sigma_{TMU} = \sqrt{D_M^2 - U_{RMS}^2}.$$

Both $U_{RMS}$ and $D_M$ are measures of the distribution widths of random variables which follow normal distributions. Accordingly, these estimates follow chi square probability distributions.

There are three situations that can arise:

1. When $U_{RMS}$ is very well determined, then the calculation proceeds by determining the confidence limits for $D_M$ by using chi-squared distribution tables. The confidence limits for TMU ($\sigma_{TMU}$) are then determined by using the above equation to relate TMU confidence limits to Mandel confidence limits.

2. When large numbers of measurements (e.g., >40 typically) are used to determine $U_{RMS}$ and $D_M$, then the chi-squared probability distributions are fairly symmetrical and a propagation of error method can be used. In this situation, the RMS uncertainty can be stated as $U_{RMS} \pm \delta_{RMS}$ and the Mandel net residual error uncertainty can be stated as $D_M \pm \delta_{Mandel}$. Then, the TMU uncertainty can be written as $\sigma_{TMU} \pm \delta_{TMU}$ where $$\delta_{TMU} = \sqrt{\frac{D_M^2}{\sigma_{TMU}^2} \delta_{Mandel}^2 + \frac{U_{RMS}^2}{\sigma_{TMU}^2} \delta_{RMS}^2}$$

The $\delta_{Mandel}$, $\delta_{TMU}$ and $\delta_{RMS}$ represent the possible deviation range for each value.

3. The most difficult case is when the number of measurements in either the determination of $U_{RMS}$ or $D_M$ or both is not large. The chi-squared probability distributions are then asymmetric and combining the uncertainties cannot be done by propagation of error.

The situation of case 3 and to a lesser extent, case 2, can also have another problem. When the confidence interval for $U_{RMS}$ is large then the TMU regression analysis depends on which value in the interval is used. This implies that $D_M$ can depend on the choice of $U_{RMS}$. In other words, a new source of error enters into the determination of TMU. If this new source of error is significant in a particular application where N is large, then the method described in case 2 cannot be used and the general solution for case 3 would be needed.

VI. General TMU Uncertainty Estimate for Preferred RMS Uncertainty Estimate

The finite size of the data set used in TMU analysis imposes an interesting property on the uncertainty of the reference measurement system ($U_{RMS}$) when $U_{RMS} = \sigma_{RMS}$, the precision of the RMS. As with any subset of the full population of a random variable in a statistical sense, the standard deviation of that subset is an estimate of the standard deviation of the full population. The particular episode of reference data gathering will manifest a particular standard deviation that is embedded in the Mandel regression output variance $\hat{\sigma}_{Mandel}^2$ such that $\hat{\sigma}_{Mandel}^2$ is a function of $\sigma_{RMS}^2$. Expressed mathematically, $$\hat{\sigma}_{Mandel}^2 = \hat{\sigma}_{Mandel}^2(\sigma_{RMS}^2).$$

The definition of TMU $$TMU = \hat{\sigma}_{TMU} = \sqrt{\hat{\sigma}_{Mandel}^2 - \sigma_{RMS}^2}$$

is predicated on $\sigma_{RMS}$ being an unbiased estimate of the embedded standard deviation of the reference measurement system for the particular episode of reference data gathering. The correlation of these two terms in the above equation indicates that the minimum uncertainty, or the best confidence, in the TMU is obtained when the estimates for the $\sigma_{RMS}^2$ and the $\hat{\sigma}_{Mandel}^2$ are gathered simultaneously. One methodology described below, within this section, achieves this simultaneous sampling objective. The same argument applies to the precision of the measurement system under test $\sigma_{MSUT}$ which is needed to determine another useful quantity often called the relative accuracy:

$$\text{Relative\_Accuracy} = \sqrt{\sigma_{Mandel}^2 - \sigma_{RMS}^2 - \sigma_{MSUT}^2}.$$

One method of gathering an estimate of the RMS uncertainty and the precision of the MSUT during the full calibration process is to perform the calibration in replicates. That is, perform the gathering of the measurement data from the RMS and the MSUT in several replication cycles. Once all of the calibration artifacts (i.e., measurement structures) have been measured by each measurement system, additional cycles of measurements are performed randomly arranging the measurement sequence each cycle. There are standard statistical methods to estimate the RMS and MSUT measurement standard deviation from this data. In this way, the standard deviations are calculated during the same time that the calibration process is executed, which also results in the output variance of the regression, $\hat{\sigma}_{Mandel}^2$.

Figure 9:
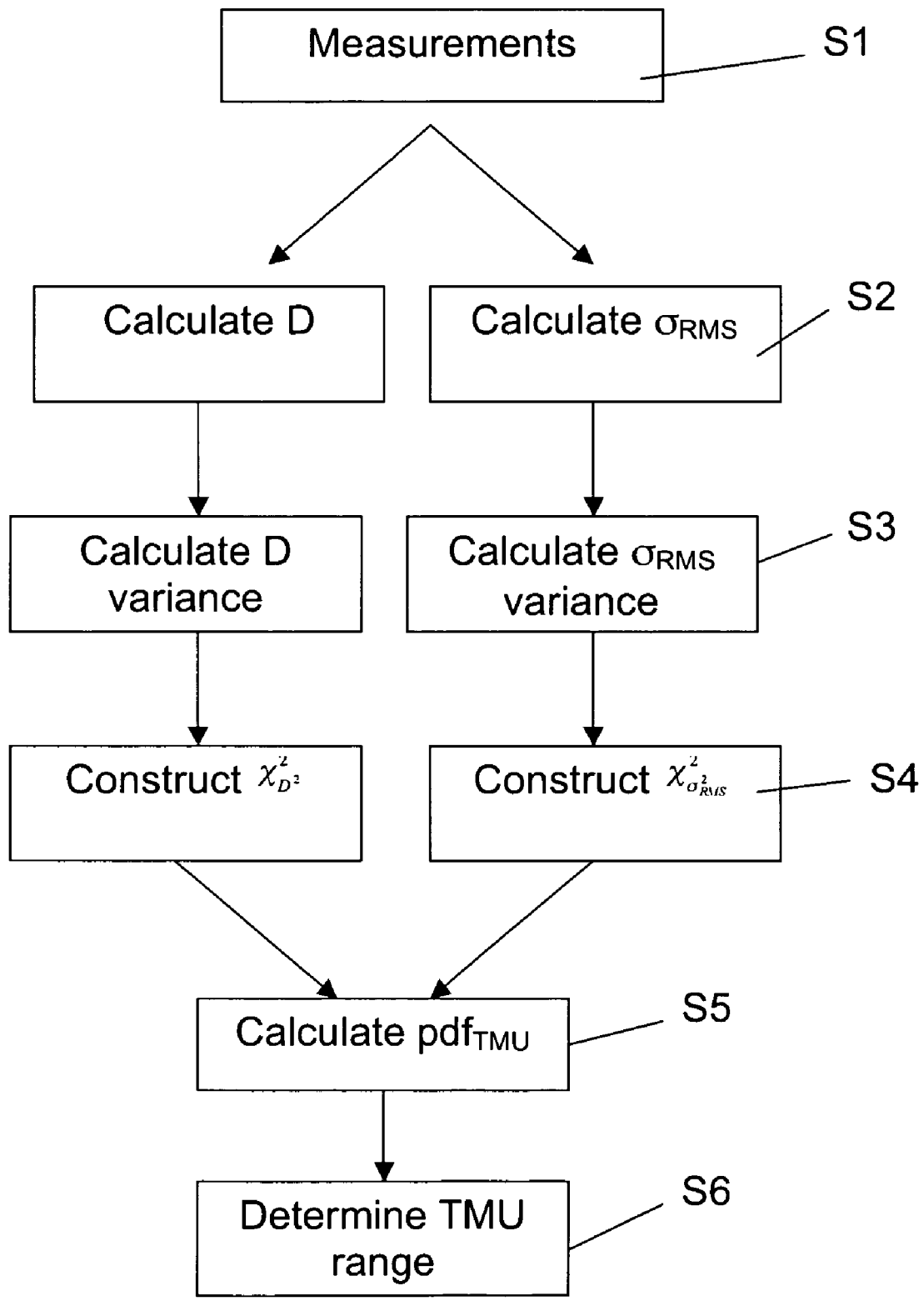
FIG. 9 shows a flow diagram of a method of determining an uncertainty in a total measurement uncertainty.

Referring to FIG. 9, a flow diagram is shown of a method according to the present invention of estimating the uncertainty of the estimated TMU, wherein a single calibration episode is treated as one of many attempts. In step S1, a plurality of measurements are made, e.g., of structures that represent variations in a semiconductor process. In step S2, a net residual error (D), e.g., a Mandel net residual error ($D_M$), and a reference measurement system uncertainty ($\sigma_{RMS}$) is calculated for each measurement. In step S3, a variance estimate is calculated for each $D_M$ and $\sigma_{RMS}$. In step S4, if histograms for these variance estimates are constructed, they will obey Chi-square ($\chi^2$) probability distribution functions (pdf), which are known functions dependent only on the number of data used in the calibration. It is well-known that forming the difference between two random variables obeying Chi-square ($\chi^2$) probability distributions produces a random variable that obeys a probability distribution function that is constructed by convolution of the starting two pdfs constrained by the algebraic expression connecting the three random variables. If the convolution operation is represented by the symbol, , then the expression for the pdf of the TMU can be represented as $$pdf_{TMU} = \chi_{D_M^2}^2 \chi_{\sigma_{RMS}^2}^2$$

where $\chi_{D_M^2}^2$ and $\chi_{\sigma_{RMS}^2}^2$ are the pdfs for $\hat{\sigma}_{Mandel}^2$ and $\sigma_{RMS}$, respectively. In step S5, such a $pdf_{TMU}$ is calculated. It is well known how to examine the pdf of a random variable to determine a range of the random variable that contains a percentage of all attempts. In step S6, the TMU range is determined. The percentage is called the confidence level and is chosen arbitrarily by the user. The range determines the uncertainty estimate for the TMU.

VII. CONCLUSION

In the previous discussion, it will be understood that the method steps discussed may be performed by a processor executing instructions of program product stored in a memory. It is understood that the various devices, modules, mechanisms and systems described herein may be realized in hardware, software, or a combination of hardware and software, and may be compartmentalized other than as shown. They may be implemented by any type of computer system or other apparatus adapted for carrying out the methods described herein. A typical combination of hardware and software could be a general-purpose computer system with a computer program that, when loaded and executed, controls the computer system such that it carries out the methods described herein. Alternatively, a specific use computer, containing specialized hardware for carrying out one or more of the functional tasks of the invention could be utilized. The present invention can also be embedded in a computer program product, which comprises all the features enabling the implementation of the methods and functions described herein, and which—when loaded in a computer system—is able to carry out these methods and functions. Computer program, software program, program, program product, or software, in the present context mean any expression, in any language, code or notation, of a set of instructions intended to cause a system having an information processing capability to perform a particular function either directly or after the following: (a) conversion to another language, code or notation; and/or (b) reproduction in a different material form.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

The invention claimed is:

1. A method for assessing a measurement system under test (MSUT), the method comprising the steps of:
   (a) providing a substrate having a plurality of structures;
   (b) measuring a dimension of the plurality of structures using a reference measurement system (RMS) to generate a first data set, and calculating an RMS uncertainty ($U_{RMS}$) from the first data set, where the RMS uncertainty ($U_{RMS}$) is defined as one of
      (i) an RMS precision;
      (ii) an independently determined RMS total measurement uncertainty ($TMU_{RMS}$); and
      (iii) $V_{U_{RMS}} = V_{ST} + V_{AG}$, wherein $V_{U_{RMS}}$ is $U_{RMS}$ expressed as a variance, $V_{ST}$ is a short term precision variance, and $V_{AG}$ is an across grating variance;
   (c) measuring the dimension of the plurality of structures using the MSUT to generate a second data set, and calculating a precision of the MSUT from the second data set;
   (d) conducting a linear regression analysis of the first and second data sets to determine a corrected precision of the MSUT and a net residual error;
   (e) determining a total measurement uncertainty (TMU) for the MSUT by removing the RMS uncertainty ($U_{RMS}$) from the net residual error; and
   (f) outputting the TMU to a system capable of optimizing the MSUT.

2. The method of claim 1, wherein the plurality of structures represent variations in a semiconductor process.

3. The method of claim 1, wherein the dimension includes at least one of line width, depth, height, sidewall angle and top corner rounding.

4. The method of claim 1, wherein the TMU for the MSUT is determined according to the formula:

$$TMU = \sqrt{D^2 - U_{RMS}^2}$$

where D is the net residual error.

5. The method of claim 1, wherein the linear regression is calculated using a Mandel linear regression wherein a ratio variable I is defined according to the formula:

$$\lambda = \frac{U_{RMS}^2}{U_{MSUT}^2}$$

where $U_{MSUT}$ is as an MSUT uncertainty defined as one of the corrected precision of the MSUT and the TMU for the MSUT.

6. The method of claim 5, wherein, in the case that the TMU for the MSUT is substantially different than the MSUT uncertainty ($U_{MSUT}$) after step (e), steps (d) and (e) are repeated using the TMU for the MSUT as the MSUT uncertainty ($U_{MSUT}$) in determining the ratio variable I.

7. The method of claim 5, wherein the TMU for the MSUT is determined according to the formula:

$$TMU = \sqrt{D_M^2 - U_{RMS}^2}$$

where $D_M$ is the Mandel net residual error.

8. The method of claim 1, wherein $V_{U_{RMS}}$ further includes at least one of a multiple reference system variance ($V_{MRMS}$) and a long term precision variance $V_{LT}$ according to the equation $$V_{U_{RMS}} = V_{ST} + V_{AG} + V_{MRMS} + V_{LT}.$$

9. The method of claim 1, further comprising the step of determining an uncertainty in the total measurement uncertainty (TMU), the method comprising the steps of:
   determining a confidence limit for a Mandel net residual error ($D_M$); and
   determining a confidence limit for the total measurement uncertainty ($\sigma_{TMU}$) according to the equation $$\sigma_{TMU} = \sqrt{D_M^2 - U_{RMS}^2},$$

where $U_{RMS}$ is a measurement uncertainty of the reference measurement system.

10. The method of claim 1, further comprising the step of estimating an uncertainty in an estimated total measurement uncertainty (TMU), comprising the steps of:
   making a plurality of measurements;
   calculating a Mandel net residual error ($D_M$) and a reference measurement system uncertainty ($\sigma_{RMS}$) for each measurement;
   calculating a variance for each $D_M$ and $\sigma_{RMS}$;
   constructing a Chi-squared probability distribution function ($\chi^2$-pdf) for the $D_M$ variances and the $\sigma_{RMS}$ variances;
   calculating a $\chi^2$-pdf for the TMU according to the equation $$pdf_{TMU} = \chi_{D_M^2}^2 \chi_{\sigma_{RMS}^2}^2,$$

wherein $pdf_{TMU}$ is the TMU $\chi^2$-pdf, $\chi_{D_M^2}^2$ is the $D_M$ variance $\chi^2$-pdf, $\chi_{\sigma_{RMS}^2}^2$ is the $\sigma_{RMS}$ variance $\chi^2$-pdf, and is a convolution operation; and
   determining a TMU range from $pdf_{TMU}$, wherein the TMU range determines the uncertainty in the estimated TMU.

11. The method of claim 1, wherein each of $D_M$ and $U_{RMS}$ is determined by at least about 40 measurements and wherein
   $s_{TMU}$ is represented as $s_{TMU} \pm d_{TMU}$;
   $U_{RMS}$ is represented as $U_{RMS} \pm d_{RMS}$;
   $D_M$ is represented as $D_M \pm d_{Mandel}$; and
   the equation $\sigma_{TMU} = \sqrt{D_M^2 - U_{RMS}^2}$ is represented as $$\delta_{TMU} = \sqrt{\frac{D_M^2}{\sigma_{TMU}^2}\delta_{Mandel}^2 + \frac{U_{RMS}^2}{\sigma_{TMU}^2}\delta_{RMS}^2}.$$

12. A method for optimizing a measurement system under test (MSUT), the method comprising the steps of:
   (a) providing a plurality of structures;
   (b) measuring a dimension of the plurality of structures according to a measurement parameter using a reference measurement system (RMS) to generate a first data set, and calculating an RMS uncertainty ($U_{RMS}$) from the first data set, where the RMS uncertainty ($U_{RMS}$) is defined as one of
      (i) an RMS precision;
      (ii) an independently determined RMS total measurement uncertainty ($TMU_{RMS}$); and
      (iii) $V_{U_{RMS}} = V_{ST} + V_{AG}$, wherein $V_{U_{RMS}}$ is $U_{RMS}$ expressed as a variance, $V_{ST}$ is a short term precision variance, and $V_{AG}$ is an across grating variance;
   (c) measuring the dimension of the plurality of structures according to the measurement parameter using the MSUT to generate a second data set, and calculating a precision of the MSUT from the second data set;
   (d) conducting a linear regression analysis of the first and second data sets to determine a corrected precision of the MSUT and a net residual error;
   (e) determining a total measurement uncertainty (TMU) for the MSUT by removing the RMS uncertainty ($U_{RMS}$) from the net residual error;
   (f) repeating steps (c) to (e) for at least one other measurement parameter;
   (g) outputting the TMU to a system capable of optimizing the MSUT; and
   (h) optimizing the MSUT by determining an optimal measurement parameter based on a minimal total measurement uncertainty.

13. The method of claim 12, further comprising the step of selecting a set of measurement parameters to be evaluated.

14. The method of claim 12, wherein the MSUT is an SEM and a measurement parameter includes at least one of: a data smoothing amount, an algorithm setting, a beam landing energy, a current, an edge detection algorithm and a scan rate.

15. The method of claim 12, wherein the MSUT is a scatterometer and a measurement parameter includes at least one of: a spectra averaging timeframe, a spectra wavelength range, an angle of incidence and area of measurement, a density of selected wavelengths and a number of adjustable characteristics in a theoretical model.

16. The method of claim 12, wherein the MSUT is an AFM and a measurement parameter includes at least one of: a number of scans, a timeframe between scans, a scanning speed, a data smoothing amount and area of measurement, and a tip shape.

17. The method of claim 12, wherein the plurality of structures represent variations in a semiconductor process.

18. The method of claim 12, wherein the dimension includes at least one of line width, depth, height, sidewall angle and top corner rounding.

19. The method of claim 12, wherein $V_{U_{RMS}}$ further includes at least one of a multiple reference system variance ($V_{MRMS}$) and a long term precision variance $V_{LT}$ according to the equation $$V_{U_{RMS}} = V_{ST} + V_{AG} + V_{MRMS} + V_{LT}.$$

20. The method of claim 12, wherein a total measurement uncertainty (TMU) for the MSUT is determined according to the formula:

$$TMU = \sqrt{D^2 - U_{RMS}^2}$$

where D is the net residual error.

21. The method of claim 12, wherein the linear regression is calculated using a Mandel linear regression wherein a ratio variable λ is defined according to the formula:

$$\lambda = \frac{U_{RMS}^2}{U_{MSUT}^2}$$

where $U_{MSUT}$ is as an MSUT uncertainty defined as one of the corrected precision of the MSUT and the TMU for the MSUT.

22. The method of claim 21, wherein, in the case that the TMU for the MSUT is substantially different than the MSUT uncertainty ($U_{MSUT}$) after step (e), steps (d) and (e) are repeated using the TMU for the MSUT as the MSUT uncertainty ($U_{MSUT}$) in determining the ratio variable λ.

23. The method of claim 12, further comprising the step of determining an uncertainty in the total measurement uncertainty (TMU), the method comprising the steps of:
   determining a confidence limit for a Mandel net residual error ($D_M$); and
   determining a confidence limit for the total measurement uncertainty ($\sigma_{TMU}$) according to the equation $$\sigma_{TMU} = \sqrt{D_M^2 - U_{RMS}^2},$$

where $U_{RMS}$ is a measurement uncertainty of the reference measurement system.

24. The method of claim 12, further comprising the step of estimating an uncertainty in an estimated total measurement uncertainty (TMU), comprising the steps of:
   making a plurality of measurements;
   calculating a Mandel net residual error ($D_M$) and a reference measurement system uncertainty ($\sigma_{RMS}$) for each measurement;
   calculating a variance for each $D_M$ and $\sigma_{RMS}$;
   constructing a Chi-squared probability distribution function ($\chi^2$-pdf) for the $D_M$ variances and the $\sigma_{RMS}$ variances;
   calculating a $\chi^2$-pdf for the TMU according to the equation $$pdf_{TMU} = \chi_{D_M^2}^2 \otimes \chi_{\sigma_{RMS}^2}^2,$$

wherein $Pdf_{TMU}$ is the TMU $\chi^2$-pdf, $\chi_{D_M^2}^2$ is the $D_M$ variance $\chi^2$-pdf, $\chi_{\sigma_{RMS}^2}^2$ is the $\sigma_{RMS}$ variance $\chi^2$-pdf, and ⊗ is a convolution operation; and
   determining a TMU range from $Pdf_{TMU}$, wherein the TMU range determines the uncertainty in the estimated TMU.

25. A method for estimating an uncertainty in an estimated total measurement uncertainty (TMU) comprising the steps of:
   making a plurality of measurements;
   calculating a Mandel net residual error ($D_M$) and a reference measurement system uncertainty ($\sigma_{RMS}$) for each measurement;
   calculating a variance for each $D_M$ and $\sigma_{RMS}$;
   constructing a Chi-squared probability distribution function ($\chi^2$-pdf) for the $D_M$ variances and the $\sigma_{RMS}$ variances;
   calculating a $\chi^2$-pdf for the TMU according to the equation $$pdf_{TMU} = \chi_{D_M^2}^2 \otimes \chi_{\sigma_{RMS}^2}^2,$$

wherein $pdf_{TMU}$ is the TMU $\chi^2$pdf, $\chi_{D_M^2}^2$ is the $D_M$ variance $\chi^2$-pdf, $\chi_{\sigma_{RMS}^2}^2$ the $\sigma_{RMS}$ variance $\chi^2$-pdf, and ⊗ is a convolution operation;
   determining a TMU range from $pdf_{TMU}$, wherein the TMU range determines the uncertainty in the estimated TMU; and
   outputting the TMU range to a system capable of optimizing a measurement system under test.

26. The method of claim 25, wherein the $\sigma_{RMS}$ is defined as one of:
   an RMS precision;
   an independently determined RMS total measurement uncertainty ($TMU_{RMS}$); and
   $V_{U_{RMS}} = V_{ST} + V_{AG}$, wherein $V_{U_{RMS}}$ expressed as a variance, $V_{ST}$ is a short term precision variance, and $V_{AG}$ is an across grating variance.

27. The method of claim 26, wherein $V_{U_{RMS}}$ further includes at least one of a multiple reference system variance ($V_{MRMS}$) and a long term precision variance $V_{LT}$ according to the equation $$V_{U_{RMS}} = V_{ST} + V_{AG} + V_{MRMS} + V_{LT}.$$

28. The method of claim 25, wherein the plurality of measurements are of structures that represent variations in a semiconductor process.

29. A method for determining an uncertainty in a total measurement uncertainty (TMU), the method comprising the steps of:
   determining a confidence limit for a net residual error from a Mandel analysis ($D_M$) using chi-squared distribution tables;
   determining a confidence limit for a total measurement uncertainty ($s_{TMU}$) according to the equation $$\sigma_{TMU} = \sqrt{D_M^2 - U_{RMS}^2},$$

where $U_{RMS}$ is a measurement uncertainty of a reference measurement system; and
   outputting the $S_{TMU}$ to a system capable of optimizing a measurement system under test.

30. The method of claim 29, wherein each of $D_M$ and $U_{RMS}$ is determined by at least about 40 measurements and wherein $s_{TMU}$ is represented as $s_{TMU} \pm d_{TMU}$;
   $U_{RMS}$ is represented as $U_{RMS} \pm d_{RMS}$;
   $D_M$ is represented as $D_M \pm d_{Mandel}$; and
   the equation $\sigma_{TMU} = \sqrt{D_M^2 - U_{RMS}^2}$ is represented as $$\delta_{TMU} = \sqrt{\frac{D_M^2}{\sigma_{TMU}^2}\delta_{Mandel}^2 + \frac{U_{RMS}^2}{\sigma_{TMU}^2}\delta_{RMS}^2}.$$

* * * * *